United States Patent
Hagihara

(10) Patent No.: US 8,525,092 B2
(45) Date of Patent: Sep. 3, 2013

(54) DATA PROCESSING METHOD AND SOLID-STATE IMAGE PICKUP DEVICE

(75) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 360 days.

(21) Appl. No.: 13/018,949

(22) Filed: Feb. 1, 2011

(65) Prior Publication Data

US 2011/0186713 A1    Aug. 4, 2011

(30) Foreign Application Priority Data

Feb. 4, 2010   (JP) .................................. 2010-023487

(51) Int. Cl.
*H01L 27/00* (2006.01)
*H03M 1/12* (2006.01)

(52) U.S. Cl.
USPC ........................................ 250/208.1; 341/155

(58) Field of Classification Search
USPC ........................................ 250/208.1; 341/155
See application file for complete search history.

(56) References Cited

U.S. PATENT DOCUMENTS 6,801,150 B2 * 10/2004 Honda .......................... 341/161

FOREIGN PATENT DOCUMENTS

JP    2005-347931 A    12/2005

* cited by examiner

*Primary Examiner* — Thanh Luu
(74) *Attorney, Agent, or Firm* — Westerman, Hattori, Daniels & Adrian, LLP

(57) ABSTRACT

A data processing method may include counting one of a plurality of clock signals with a first mode, counting clock signals based on a predetermined number of the plurality of clock signals with the first mode, to output a first clock signal every time a counter value becomes a first predetermined value, counting the first clock signal with the first mode, counting one of the clock signals with a second mode while the counted value is considered as a first initial value, counting clock signals based on the predetermined number of the plurality of clock signals with the second mode, to output a second clock signal every time the counter value becomes a second predetermined value while the counted value is considered as a second initial value, counting the second clock signal with the second mode, and outputting the counter values with the second mode as difference data between a first data signal and a second data signal.

4 Claims, 15 Drawing Sheets

FIG. 1

| | STATE | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|---|
| (1) | CK1 | 0 | 0 | 1 | 1 | 1 | 1 | 1 | 1 | 1 | 1 | 1 | 0 | 0 | 0 | 0 | 0 | 0 | 0 |
| | CK3 | 0 | 0 | 0 | 0 | 1 | 1 | 1 | 1 | 1 | 1 | 1 | 1 | 1 | 0 | 0 | 0 | 0 | 0 |
| | CK5 | 0 | 0 | 0 | 0 | 0 | 0 | 1 | 1 | 1 | 1 | 1 | 1 | 1 | 1 | 1 | 0 | 0 | 0 |
| | CK7 | 0 | 0 | 0 | 0 | 0 | 0 | 0 | 0 | 1 | 1 | 1 | 1 | 1 | 1 | 1 | 1 | 1 | 0 |
| | CK0 | 1 | 0 | 0 | 0 | 0 | 0 | 0 | 0 | 0 | 0 | 1 | 1 | 1 | 1 | 1 | 1 | 1 | 1 |
| | CK2 | 1 | 1 | 1 | 0 | 0 | 0 | 0 | 0 | 0 | 0 | 0 | 0 | 1 | 1 | 1 | 1 | 1 | 1 |
| | CK4 | 1 | 1 | 1 | 1 | 1 | 0 | 0 | 0 | 0 | 0 | 0 | 0 | 0 | 0 | 1 | 1 | 1 | 1 |
| | CK6 | 1 | 1 | 1 | 1 | 1 | 1 | 1 | 0 | 0 | 0 | 0 | 0 | 0 | 0 | 0 | 0 | 1 | 1 |
| | CK8 | 1 | 1 | 1 | 1 | 1 | 1 | 1 | 1 | 1 | 0 | 0 | 0 | 0 | 0 | 0 | 0 | 0 | 0 |
| (2) | XCK8 | 0 | 0 | 0 | 0 | 0 | 0 | 0 | 0 | 0 | 1 | 1 | 1 | 1 | 1 | 1 | 1 | 1 | 1 |
| (3) | XCK8⊕CK1 | 0 | 0 | 1 | 1 | 1 | 1 | 1 | 1 | 1 | 0 | 0 | 1 | 1 | 1 | 1 | 1 | 1 | 1 |
| | XCK8⊕CK3 | 0 | 0 | 0 | 0 | 1 | 1 | 1 | 1 | 1 | 0 | 0 | 0 | 0 | 1 | 1 | 1 | 1 | 1 |
| | XCK8⊕CK5 | 0 | 0 | 0 | 0 | 0 | 0 | 1 | 1 | 1 | 0 | 0 | 0 | 0 | 0 | 0 | 1 | 1 | 1 |
| | XCK8⊕CK7 | 0 | 0 | 0 | 0 | 0 | 0 | 0 | 0 | 1 | 0 | 0 | 0 | 0 | 0 | 0 | 0 | 0 | 1 |
| | CK8⊕CK0 | 0 | 1 | 1 | 1 | 1 | 1 | 1 | 1 | 1 | 0 | 1 | 1 | 1 | 1 | 1 | 1 | 1 | 1 |
| | CK8⊕CK2 | 0 | 0 | 0 | 1 | 1 | 1 | 1 | 1 | 1 | 0 | 0 | 0 | 1 | 1 | 1 | 1 | 1 | 1 |
| | CK8⊕CK4 | 0 | 0 | 0 | 0 | 0 | 1 | 1 | 1 | 1 | 0 | 0 | 0 | 0 | 0 | 1 | 1 | 1 | 1 |
| | CK8⊕CK6 | 0 | 0 | 0 | 0 | 0 | 0 | 0 | 1 | 1 | 0 | 0 | 0 | 0 | 0 | 0 | 0 | 1 | 1 |
| (3)' | COUNTER VALUE OF (3) | 0 | 1 | 2 | 3 | 4 | 5 | 6 | 7 | 8 | 0 | 1 | 2 | 3 | 4 | 5 | 6 | 7 | 8 |
| (4) | XCK8⊕GND | 0 | 0 | 0 | 0 | 0 | 0 | 0 | 0 | 0 | 1 | 1 | 1 | 1 | 1 | 1 | 1 | 1 | 1 |
| (4)' | COUNTER VALUE OF (4) | 0 | 0 | 0 | 0 | 0 | 0 | 0 | 0 | 0 | 9 | 9 | 9 | 9 | 9 | 9 | 9 | 9 | 9 |
| (5) | TOTAL ( (3)' + (4)' ) | 0 | 1 | 2 | 3 | 4 | 5 | 6 | 7 | 8 | 9 | 10 | 11 | 12 | 13 | 14 | 15 | 16 | 17 |

FIG. 5

| | STATE | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|---|
| (1) | XCK0 | 0 | 1 | 1 | 1 | 1 | 1 | 1 | 1 | 1 | 1 | 0 | 0 | 0 | 0 | 0 | 0 | 0 | 0 |
| | CK1 | 0 | 0 | 1 | 1 | 1 | 1 | 1 | 1 | 1 | 1 | 1 | 0 | 0 | 0 | 0 | 0 | 0 | 0 |
| | XCK2 | 0 | 0 | 0 | 1 | 1 | 1 | 1 | 1 | 1 | 1 | 1 | 1 | 0 | 0 | 0 | 0 | 0 | 0 |
| | CK3 | 0 | 0 | 0 | 0 | 1 | 1 | 1 | 1 | 1 | 1 | 1 | 1 | 1 | 0 | 0 | 0 | 0 | 0 |
| | XCK4 | 0 | 0 | 0 | 0 | 0 | 1 | 1 | 1 | 1 | 1 | 1 | 1 | 1 | 1 | 0 | 0 | 0 | 0 |
| | CK5 | 0 | 0 | 0 | 0 | 0 | 0 | 1 | 1 | 1 | 1 | 1 | 1 | 1 | 1 | 1 | 0 | 0 | 0 |
| | XCK6 | 0 | 0 | 0 | 0 | 0 | 0 | 0 | 1 | 1 | 1 | 1 | 1 | 1 | 1 | 1 | 1 | 0 | 0 |
| | CK7 | 0 | 0 | 0 | 0 | 0 | 0 | 0 | 0 | 1 | 1 | 1 | 1 | 1 | 1 | 1 | 1 | 1 | 0 |
| (2) | XCK8 | 0 | 0 | 0 | 0 | 0 | 0 | 0 | 0 | 0 | 1 | 1 | 1 | 1 | 1 | 1 | 1 | 1 | 1 |
| (3) | XCK8⊕XCK0 | 0 | 1 | 1 | 1 | 1 | 1 | 1 | 1 | 1 | 0 | 1 | 1 | 1 | 1 | 1 | 1 | 1 | 1 |
| | XCK8⊕CK1 | 0 | 0 | 1 | 1 | 1 | 1 | 1 | 1 | 1 | 0 | 0 | 1 | 1 | 1 | 1 | 1 | 1 | 1 |
| | XCK8⊕XCK2 | 0 | 0 | 0 | 1 | 1 | 1 | 1 | 1 | 1 | 0 | 0 | 0 | 1 | 1 | 1 | 1 | 1 | 1 |
| | XCK8⊕CK3 | 0 | 0 | 0 | 0 | 1 | 1 | 1 | 1 | 1 | 0 | 0 | 0 | 0 | 1 | 1 | 1 | 1 | 1 |
| | XCK8⊕XCK4 | 0 | 0 | 0 | 0 | 0 | 1 | 1 | 1 | 1 | 0 | 0 | 0 | 0 | 0 | 1 | 1 | 1 | 1 |
| | XCK8⊕CK5 | 0 | 0 | 0 | 0 | 0 | 0 | 1 | 1 | 1 | 0 | 0 | 0 | 0 | 0 | 0 | 1 | 1 | 1 |
| | XCK8⊕XCK6 | 0 | 0 | 0 | 0 | 0 | 0 | 0 | 1 | 1 | 0 | 0 | 0 | 0 | 0 | 0 | 0 | 1 | 1 |
| | XCK8⊕CK7 | 0 | 0 | 0 | 0 | 0 | 0 | 0 | 0 | 1 | 0 | 0 | 0 | 0 | 0 | 0 | 0 | 0 | 1 |
| (3)' | COUNTER VALUE OF (3) | 0 | 1 | 2 | 3 | 4 | 5 | 6 | 7 | 8 | 0 | 1 | 2 | 3 | 4 | 5 | 6 | 7 | 8 |
| (4) | XCK8⊕GND | 0 | 0 | 0 | 0 | 0 | 0 | 0 | 0 | 0 | 1 | 1 | 1 | 1 | 1 | 1 | 1 | 1 | 1 |
| (4)' | COUNTER VALUE OF (4) | 0 | 0 | 0 | 0 | 0 | 0 | 0 | 0 | 0 | 9 | 9 | 9 | 9 | 9 | 9 | 9 | 9 | 9 |
| (5) | TOTAL ((3)' + (4)') | 0 | 1 | 2 | 3 | 4 | 5 | 6 | 7 | 8 | 9 | 10 | 11 | 12 | 13 | 14 | 15 | 16 | 17 |

US 8,525,092 B2

DATA PROCESSING METHOD AND SOLID-STATE IMAGE PICKUP DEVICE

BACKGROUND OF THE INVENTION

1. Field of the Invention

The present invention relates to a data processing method that binarizes a data signal output from a delay circuit and a solid-state image pickup device using the method.

Priority is claimed on Japanese Patent Application No. 2010-023487, filed Feb. 4, 2010, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

FIG. 14 is a view illustrating a portion of an analogue-digital (A/D) converter circuit for counting of a time, i.e., a so-called Time to Digital Converter (TDC) type A/D converter circuit in accordance with the related art. The circuit illustrated in FIG. 14 includes an annulus ring delay circuit 201, which includes a plurality of inverting elements (NAND0, INV1 through INV8) which are connected to each other so as to be formed into a ring shape, a latch circuit 202, which holds outputs from the annulus ring delay circuit 201, a binarizing circuit (i.e., a full-encoder circuit) 203, which binarizes values held by the latch circuit 202, a counter circuit 204, which counts with respect to one of the outputs from the annulus ring delay circuit 201 as a count clock, and a memory circuit 205, which holds an output from the binarizing circuit 203 and an output from the counter circuit 204.

The A/D conversion operation in accordance with the related art will be described below. FIG. 15 is a view illustrating an operation timing of the circuit illustrated in FIG. 14. A logic state of a start pulse StartP changes from an L-state to an H-state, thereby logic states of the inverting elements included in the annulus ring delay circuit 201 sequentially change. Accordingly, pulses surround around the annulus ring delay circuit 201. After a predetermined time period, the latch circuit 202 holds (latches) the outputs from the annulus ring delay circuit 201. As illustrated in FIG. 15, the outputs from the annulus ring delay circuit 201, respectively, correspond to any one of 18 states (i.e., a state 0 through a state 17). The outputs from the annulus ring delay circuit 201 held (i.e., latched) by the latch circuit 202 are fully encoded (i.e., parallelly encoded) by a binarizing circuit 203 to generate binary encoded data (i.e., a lower counter value). The counter circuit 204 performs counting of the output of an inverting element INV8 as a count clock, thereby generating a count value (i.e., an upper counter value). The lower counter value and the upper counter value are stored in a memory circuit 205 to be output to the subsequent circuit in the form of digital data.

A typical data processing method in accordance with the related art includes a method that a data signal is fully encoded (i.e., parallelly encoded) by using a full-encoder circuit (hereinafter referred to as the "encoder circuit"). In this method, an output of each of the inverting elements included in the delay circuit is parallelly input into the encoder circuit and, based on a logic state thereof, binary encoded data is generated.

The above-described A/D converter circuit is applied to, for example, a solid-state image pickup device. Japanese Unexamined Patent Application, First Publication No. 2005-347931 discloses an A/D converter circuit that is arranged for each of rows of pixels in order to perform an A/D conversion outputs from the pixels.

In the above-described fully-encoding type data processing method, the necessary number of input terminals in the encoder circuit corresponds to the number of data signals. More specifically, in a case of obtaining 2-bit binary encoded data, 4 input terminals are required. In a case of obtaining 4-bit binary encoded data, 16 input terminals are required. Consequently, it is required to prepare the number of signal lines corresponding to the number of input terminals in order to connect the latch circuit with the encoder circuit. In a case where the encoder circuit for outputting the 4-bit binary encoded data is installed in, for example, a so-called column unit, having an area including narrow pitches, of the solid-state image pickup device, the encoder circuit is required to be built-in with pitches approximately equal to pixel pitches (i.e., equal to or less than a several um).

SUMMARY

A data processing method may perform a differential processing between a first data signal and a second data signal based on an output of a delay circuit, the delay circuit including a plurality of inverting elements that are connected to each other. The data processing method may include: counting, by an upper counting unit, one of a plurality of clock signals output from the delay circuit with a first mode, the first mode being either one of a down-count mode and an up-count mode; counting, by a lower counting unit, clock signals based on a predetermined number of the plurality of clock signals output from the delay circuit with the first mode, to output a first clock signal to the upper counting unit every time a counter value becomes a first predetermined value; counting, by the upper counting unit, the first clock signal from the lower counting unit with the first mode; counting, by the upper counting unit, one of the plurality of clock signals output from the delay circuit with a second mode, the second mode being the other one of the either one of the down-count mode and the up-count mode, while the value counted with the first mode is considered as a first initial value; counting, by the lower counting unit, clock signals based on the predetermined number of the plurality of clock signals output from the delay circuit with the second mode, to output a second clock signal to the upper counting unit every time the counter value becomes a second predetermined value while the value counted with the first mode is considered as a second initial value; counting, by the upper counting unit, the second clock signal from the lower counting unit with the second mode; and outputting the counter values counted by the upper counting unit and the lower counting unit with the second mode as difference data between the first data signal and the second data signal.

A data processing method may include: latching, by a latch circuit, a predetermined number of clock signals output from a delay circuit comprising a plurality of inverting elements, which are connected each other, as data signals; performing sequentially, while one of the latched data signals is considered as a main latch signal, one of an exclusive-OR operation and an nonexclusive-OR operation between the main latch signal or an inverted main latch signal and the other data signals by a calculation circuit; outputting one of a first value and a second value as a counter value based on the main latch signal, the first value being obtained such that a counter circuit performs counting of the results of one of the exclusive-OR operation and the nonexclusive-OR operation, the second value being the sum of the first value and a third value, the third value being obtained such that the counter circuit performs counting of the predetermined number of clock signals.

The delay circuit may be an annulus ring delay circuit comprising the plurality of inverting elements that are connected each other so as to form an annular shape.

A data processing method may include: latching, by a latch circuit, a predetermined number of clock signals output from a delay circuit comprising a plurality of inverting elements that are connected each other as data signals; performing sequentially, by a calculation circuit, while one of the latched data signals is considered as a main latch signal, one of an exclusive-OR operation and an nonexclusive-OR operation between either one of odd-numbered data signals and even-numbered data signals based on an connection order of the inverting elements or inverted signals of the data signals of the other one of the odd-numbered data signals or the even-numbered data signals and the main latch signal or an inverted main latch signal; and outputting one of a first value and a second value as a counter value based on the main latch signal, the first value being obtained such that a counter circuit performs counting of the results of one of the exclusive-OR operation and the nonexclusive-OR operation, the second value being the sum of the first value and a third value, the third value being obtained such that the counter circuit performs counting of the predetermined number of clock signals.

The delay circuit may be an annulus ring delay circuit comprising the plurality of inverting elements that are connected each other so as to form an annular shape.

The data processing method may perform differential processing between a first data signal and a second data signal based on outputs of the delay circuit. The data processing method may further include: counting, by the counter circuit, with either one of a down-count mode and an up-count mode in count processing of the first data signal; and outputting, in the counting processing of the second data signal, a counter value as difference data between the first data signal and the second data signal after the counter circuit performs counting with the other one of the either one of the down-count mode and the up-count mode while the value counted with the one of the modes is considered as an initial value.

The data processing method may further include: performing the counting with the down-count mode and the up-count mode, an up-down counter capable of switching modes being shared between the down-count mode and the up-count mode, a processing mode of the up-down counter being switched to perform the counting.

A solid-state image pickup device may include: an image capturing unit comprising a plurality of pixels, which output pixel signals based on the amount of incident electromagnetic waves, arranged in a matrix shape; a reference signal generation unit configured to generate a reference signal that increases or decreases through time; a comparison unit configured to perform a comparison between the pixel signals output from the pixels and the reference signal, which are to be A/D converted, and ends the comparison at a timing that the reference signal satisfies a predetermined condition with respect to the pixel signals; a delay circuit having a plurality of inverting elements; an upper counting unit configured to perform counting of clock signals from the delay circuit; a lower latching unit configured to latch a predetermined number of clock signals output from the delay circuit at a timing based on the end of the comparison processing; and a lower counting unit configured to perform counting of clock signals based on the predetermined number of the clock signals latched by the lower latching unit.

A data processing method, which is performed by the upper counting unit and the lower counting unit, may include: counting, by the upper counting unit, one of a plurality of clock signals output from the delay circuit with a first mode, the first mode being either one of a down-count mode and an up-count mode; counting, by the lower counting unit, clock signals based on a predetermined number of the plurality of clock signals that is latched by the lower latching unit with the first mode, to output a first clock signal to the upper counting unit every time a counter value becomes a first predetermined value; counting, by the upper counting unit, the first clock signal from the lower counting unit with the first mode; counting, by the upper counting unit, one of the plurality of clock signals output from the delay circuit with a second mode, the second mode being the other one of the either one of the down-count mode and the up-count mode, while the value counted with the first mode is considered as a first initial value; counting, by the lower counting unit, clock signals based on the predetermined number of the plurality of clock signals that is latched by the lower latching unit with the second mode, to output a second clock signal to the upper counting unit every time the counter value becomes a second predetermined value while the value counted with the first mode is considered as a second initial value; counting, by the upper counting unit, the second clock signal from the lower counting unit with the second mode; and outputting the counter values counted by the upper counting unit and the lower counting unit with the second mode as difference data between the first data signal and the second data signal that are based on the output from the delay circuit according to the pixel signals.

The pixel signals may include a reference level and a signal level. The first data signal is based on an output of the delay circuit according to either one of the reference level and the signal level. The second data signal is based on an output of the delay circuit according to another one of the reference level and the signal level.

A data processing method, which is performed by the lower counting unit, may include: latching, by the lower latching unit, a predetermined number of clock signals output from the delay circuit as data signals; performing sequentially, while the predetermined number of the plurality of clock signals, which are latched by the lower latching unit, are considered as data signals and one of the data signals is considered as a main latch signal, one of an exclusive-OR operation and an nonexclusive-OR operation between the main latch signal or an inverted main latch signal and the other data signals by a calculation circuit; outputting one of a first value and a second value as a counter value based on the main latch signal, the first value being obtained such that a counter circuit performs counting of the results of one of the exclusive-OR operation and the nonexclusive-OR operation, the second value being the sum of the first value and a third value, the third value being obtained such that the counter circuit performs counting of the predetermined number of clock signals.

The delay circuit may be an annulus ring delay circuit comprising the plurality of inverting elements that are connected each other so as to form an annular shape.

A data processing method, which is performed by the lower counting unit, may include: latching, by the lower latching unit, a predetermined number of clock signals output from the delay circuit as data signals; performing sequentially, by a calculation circuit, while the predetermined number of the plurality of clock signals, which are latched by the lower latching unit, are considered as data signals and one of the data signals is considered as a main latch signal, one of an exclusive-OR operation and an nonexclusive-OR operation between either one of odd-numbered data signals and even-numbered data signals based on an connection order of the inverting elements or inverted signals of the data signals of the other one of the odd-numbered data signals or the even-numbered data signals and the main latch signal or an inverted main latch signal; and outputting one of a first value and a second value as a counter value based on the main latch signal, the first value being obtained such that a counter circuit performs counting of the results of one of the exclusive-OR operation and the nonexclusive-OR operation, the second value being the sum of the first value and a third value, the third value being obtained such that the counter circuit performs counting of the predetermined number of clock signals.

The delay circuit may be an annulus ring delay circuit comprising the plurality of inverting elements that are connected each other so as to form an annular shape.

The pixel signals may include a reference level and a signal level, and performs data processing of the data signals based on the output of the delay circuit according to the reference level and the signal level.

The data processing method may perform differential processing between a first data signal and a second data signal based on outputs of the delay circuit, the first data signal being based on an output of the delay circuit according to either one of the reference level and the signal level, the second data signal being based on an output of the delay circuit according to another one of the reference level and the signal level. The data processing method may further include: counting, by the counter circuit, with either one of a down-count mode and an up-count mode in count processing of the first data signal; and outputting, in the counting processing of the second data signal, a counter value as difference data between the first data signal and the second data signal after the counter circuit performs counting with the other one of the either one of the down-count mode and the up-count mode while the value counted with the one of the modes is considered as an initial value.

BRIEF DESCRIPTION OF THE DRAWINGS

The above features and advantages of the present invention will be more apparent from the following description of certain preferred embodiments taken in conjunction with the accompanying drawings, in which:

FIG. 1 is a reference view illustrating a data processing method in accordance with a first preferred embodiment of the present invention;

FIG. 5 is a reference view illustrating a data processing method in accordance with a second preferred embodiment of the present invention;

FIG. 14 is a block diagram partially illustrating a configuration of the A/D converter circuit in accordance with the related art; and.

DETAILED DESCRIPTION OF THE PREFERRED EMBODIMENTS

Figure 2:
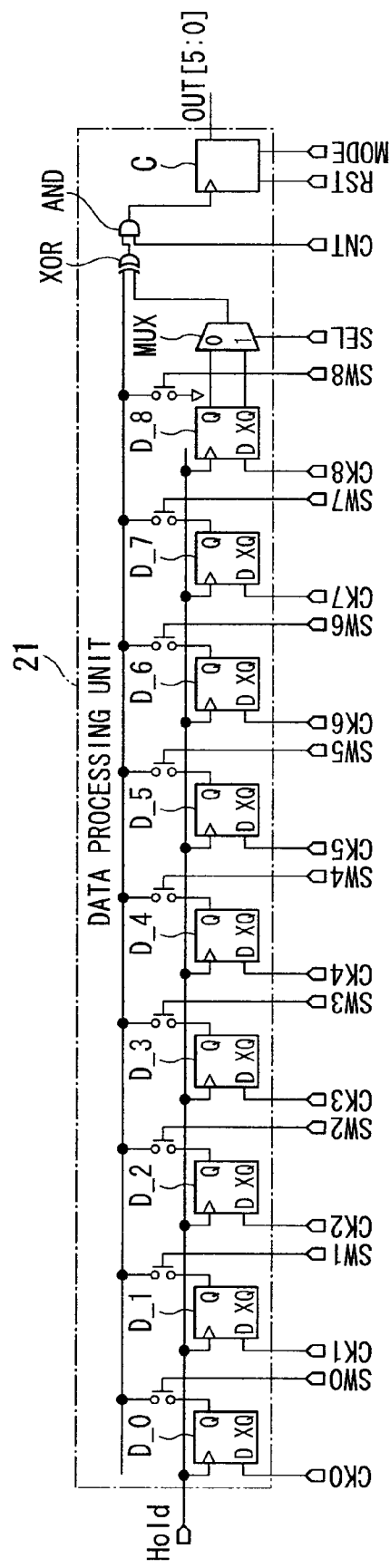
FIG. 2 is a block diagram illustrating a configuration of a data processing unit in accordance with the first preferred embodiment of the present invention.

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Preferred embodiment

A first preferred embodiment of the present invention will be described below. FIG. 1 is a view illustrating an example of a data processing method in accordance with the first preferred embodiment of the present invention. Hereinafter, a description is made with reference to FIG. 1. An annulus ring delay circuit for realizing the data processing method illustrated in FIG. 1 will be described provided that the annulus ring delay circuit has a configuration identical to that of an annulus ring delay circuit 201 illustrated in FIG. 14. However, the configuration of the annulus ring delay circuit is not necessarily limited to this configuration.

"(1)" of FIG. 1 illustrates logic states (i.e., a logic state of each of data signals) in each state (i.e., states 0 through 17) of clock signals (i.e., CK0 through CK8) of a predetermined number (e.g., 9 in this case), the clock signals being output from the annulus ring delay circuit.

"(2)" of FIG. 1 illustrates a logic state of a signal XCK8 which is an inverted signal of CK8 as a main latch signal.

"(3)" of FIG. 1 illustrates results of an exclusive-OR operation between the signal CK8 or the signal XCK8 and the signals CK0 through CK7 as latch signals other than the signal CK8 and the signal XCK8.

"(3)'" of FIG. 1 illustrates counter values obtained by performing counting of the results of the exclusive-OR operation illustrated in "(3)" (in this case, the number of H-states). These counter values are different for each state (i.e., any one of the states 0 through 8) in each of the first half states (i.e., states 0 through 8) and the last half states (i.e., states 9 through 17) of data signals.

"(4)" of FIG. 1 illustrates results of the exclusive-OR operation between the signal XCK8 and a ground GND (i.e., an L-state).

"(4)'" of FIG. 1 illustrates counter values obtained by performing counting of a predetermined number (i.e., 9 times in this case) of the results of the excusive-OR operation in "(4)" (i.e., the number of H-states in this case). This means that in which states the data signal is between the first half states (i.e., the states 0 through 8) and the last half states (i.e., the states 9 through 17) is determined by a state (i.e., H/L-state) of (an inverted signal of) the main latch signal in each of the states (i.e., the states 0 through 17). In a case where the data signal is in the first half states (i.e., the states 0 through 8), the counter values become 0, whereas, in a case where the data signal is in the last half states (i.e., the states 9 through 17), the counter values become 9.

"(5)" of FIG. 1 illustrates counter values obtained by summing the counter values of "(3)'" and the counter values of "(4)'". In FIG. 1, a case where the counting is performed with an up-count mode is described, so that the counter value becomes 0, for example, in state 0, and the counter value becomes 17, for example, in state 17. As described above, the counter values illustrated in "(5)" become values unique to each of the states 0 through 17. With respect to the states 0 through 8, since the results of the exclusive-OR operation in "(4)" are 0, the counter values in "(5)" are equivalent to the counter values in "(3)". In other words, with respect to the states 0 through 8, outputting of the counter values in "(5)" is equivalent to outputting of the counter values in "(3)".

FIG. 2 illustrates an example of a specific circuit configuration for realizing the data processing method of FIG. 1. The circuit configuration of FIG. 2 will be described below.

A data processing unit 21 illustrated in FIG. 2 binarizes data signals as clock signals output from the annulus ring delay circuit. The data processing unit 21 includes latch circuits D_0 through D_8 for latching the predetermined number of clock signals CK0 through CK8 output from the annulus ring delay circuit, a selection circuit MUX for switching an output (Q/XQ) of the latch circuit D_8, a calculation circuit XOR for performing an exclusive-OR operation, a calculation circuit AND for performing AND operation that performs counting of results of the exclusive-OR operation, and a counter circuit C capable of performing the counting in both modes such as an up-count mode and a down-count mode.

The Most Significant Bit (MSB) of the counter circuit C is a flag bit for determining a positive state or a negative state. Based on a control signal Hold to be input into the latch circuits D_0 through D_8, logic states of the clock signals CK0 through CK8 at a time at which the predetermined condition is satisfied are latched. Any one of the outputs Q of the latch circuits D_0 through D_7 and a ground GND is output to one of input terminals of the calculation circuit XOR by using control signals SW0~SW8 of switches. The output (Q/XQ) of the latch circuit D_8 is selected to be output by a control signal SEL of the selection circuit MUX. The counter circuit C is reset by a control signal RST of the counter circuit C. An operation mode of the counter circuit C is switched by a control signal MODE. A counting operation of the counter circuit C is controlled by a control signal CNT of the calculation circuit AND. Accordingly, counter values can be obtained based on states (i.e., states 0 through 17) of data signals. In a case where the operation mode is switched, in order to avoid discontinuity (i.e., destruction) of data (possibly) generated at a time of switching the operation mode, the counter circuit C preferably includes a counter circuit having, for example, a data storage function.

Figure 3:
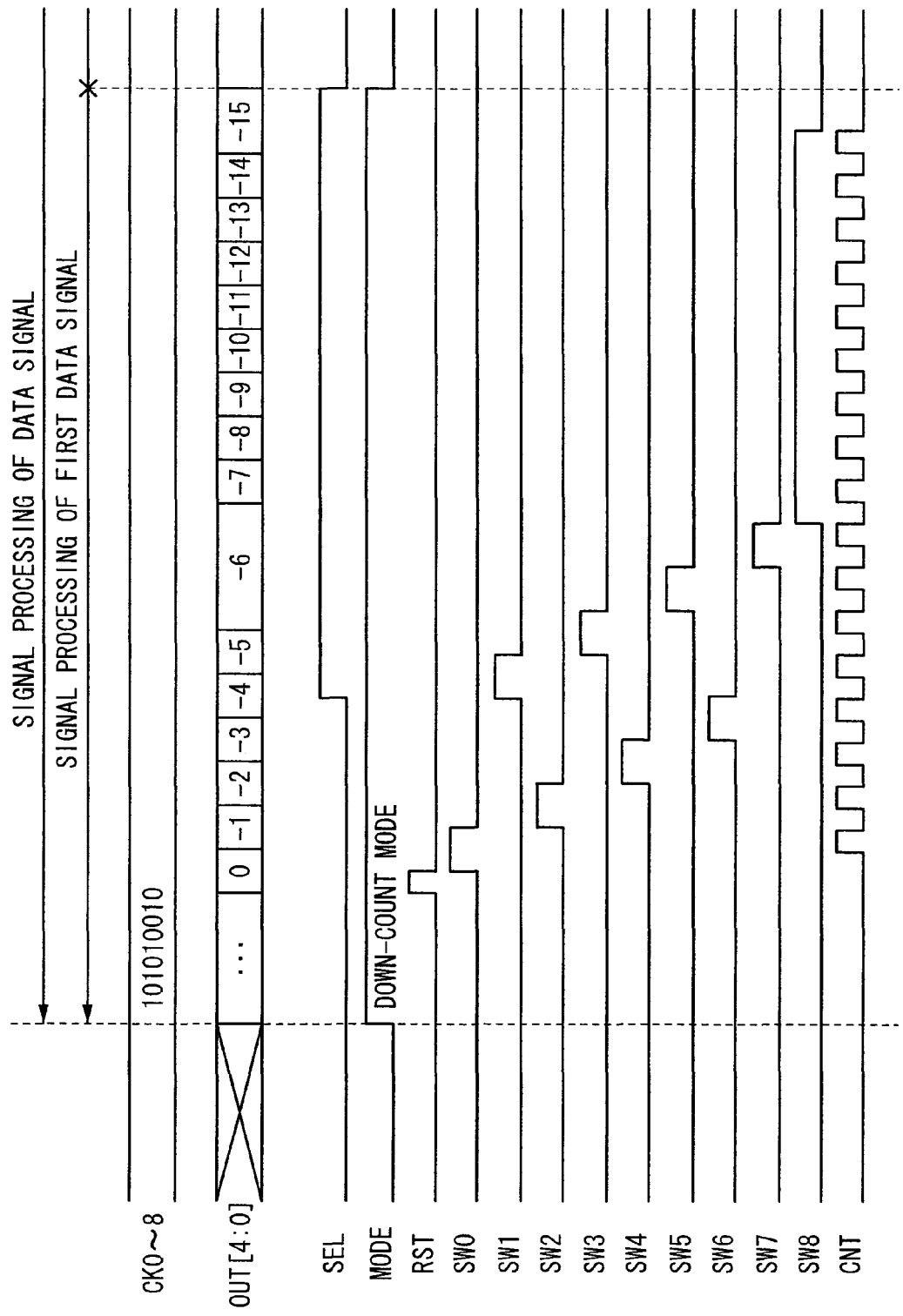
FIG. 3 is a timing chart illustrating an operation of the data processing unit in accordance with the first preferred embodiment of the present invention.
Figure 4:
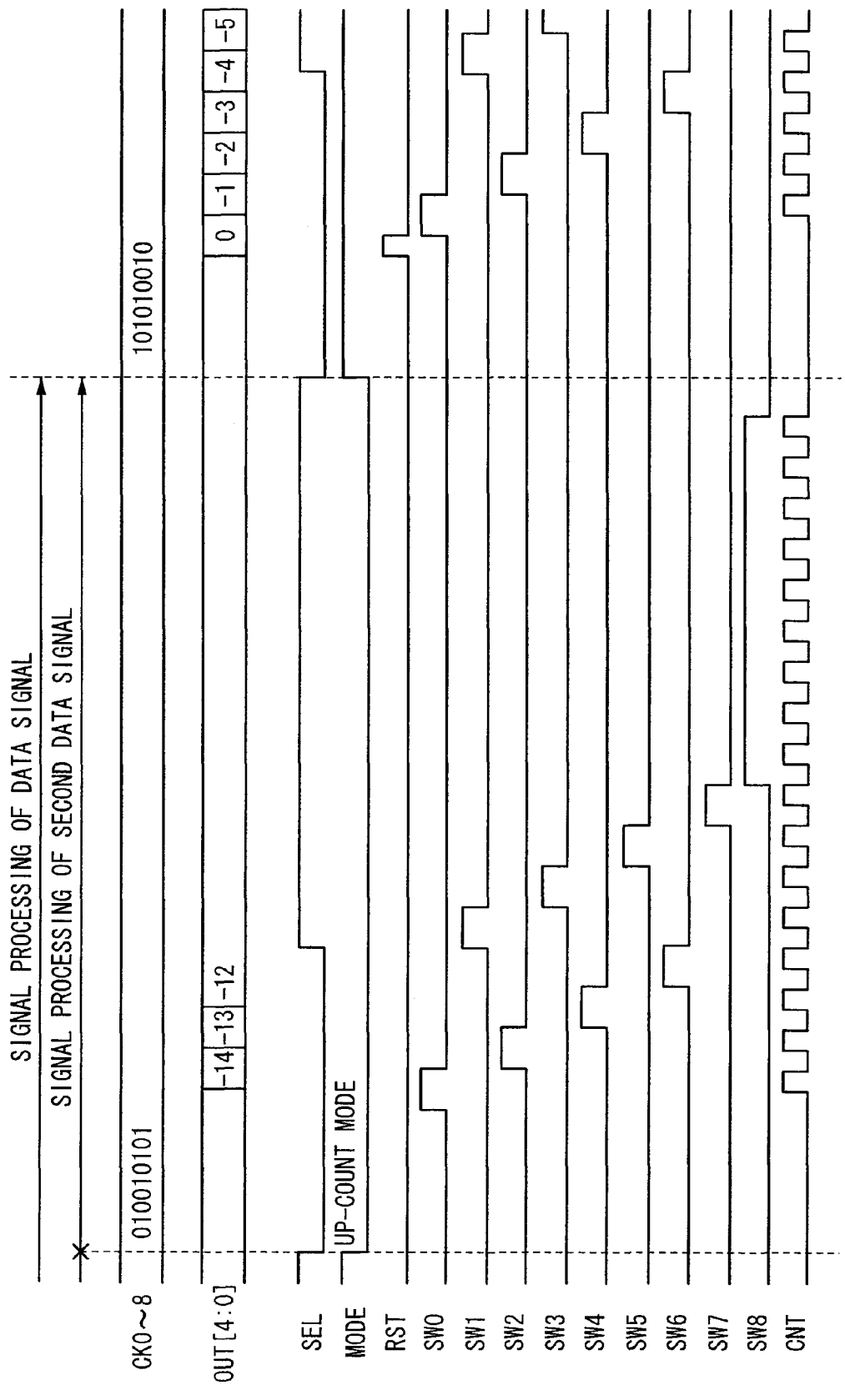
FIG. 4 is a timing chart illustrating another operation of the data processing unit in accordance with the first preferred embodiment of the present invention.

An operation of the data processing unit 21 will be described with reference to a specific example. It is provided that a first data signal is in a state 15 and a second data signal is in a state 3, respectively. In the first data signal, CK0: H-state/CK1: L-state/CK2: H-state/CK3: L-state/CK4: H-state/CK5: L-state/CK6: L-state/CK7: H-state/CK8: L-state. In the second data signal, CK0: L-state/CK1: H-state/ CK2: L-state/CK3: L-state/CK4: H-state/CK5: L-state/CK6: H-state/ CK7: L-state/CK8: H-state. FIGS. 3 and 4, respectively, illustrate an operation of the data processing unit 21. Initially, an operation illustrated in FIG. 3 is performed, followed by an operation illustrated in FIG. 4. The logic states of the clock signals CK0 through CK8 are latched as data signals by the latch circuits D_0 through D_8, respectively, based on a control signal Hold before the following operation is performed.

First, the first data signal is processed. Initially, the control signal MODE is set to an H-state. Accordingly, the counter circuit C performs the counting with a down-count mode. Subsequently, the control signal RST is set to an H-state. Accordingly, a counter value of the counter circuit C is reset to 0. Subsequently, the control signal SEL is set to an L-state and thereby the control signals SW0, SW2 SW4, and SW6 are sequentially turned ON. The calculation circuit XOR performs the exclusive-OR operation between the main latch signal CK8 and the clock signals CK0, CK2, CK4, and CK6, respectively. Then, the counter circuit C performs counting of the results thereof (i.e., the number of H-states). The counter value at the moment is −3.

Then, the control signal SEL is set to an H-state and thereby the control signals SW1, SW3, SW5, and SW7 are sequentially turned ON.

The calculation circuit XOR performs the exclusive-OR operation between a signal XCK8 that is an inverted signal of the main latch signal CK8 and the clock signals CK1, CK3, CK5, and CK7, respectively. Then, the counter circuit C performs counting of the results thereof (i.e., the number of H-states). The counter value at the moment is −6. Finally, the control signal SW8 is turned ON. The calculation circuit XOR performs the exclusive-OR operation between the signal XCK 8 and the ground GND. Then, the counter circuit C performs counting of the results thereof (i.e., H-states) 9 times. The counter value at the moment is −15. In a case where the data processing is performed only with respect to the first data signal, the counter value at the moment is output from the counter circuit C.

Now, the second data signal is processed. Initially, the control signal MODE is set to an L-state. Accordingly, the counter circuit C performs the counting with the up-count mode. Since a reset operation based on the control signal RST is not performed, an initial value of the counter value of the counter circuit C is left to −15. The control signal SEL is set to an L-state and thereby, the control signals SW0, SW2, SW4, and SW6 are sequentially turned ON. The calculation circuit XOR performs the exclusive-OR operation between the main latch signal CK8 and clock signals CK-, CK2, CK4, and CK6, respectively. Then, the counter circuit C performs counting of the results thereof (i.e., the number of H-states). The counter value at the moment is −13.

Subsequently, the control signal SEL is set to an H-state, and thereby the control signals SW1, SW3, SW5, and SW7 are sequentially turned ON.

The calculation circuit XOR performs the exclusive-OR operation between the signal XCK8 that is the inverted signal of the main latch signal CK8 and the clock signals CK1, CK3, CK5, and CK7, respectively. Then, the counter circuit C performs counting of the results thereof (i.e., the number of H-states). The counter value at the moment is −12. Finally, the control signal SW8 is turned ON. The calculation circuit XOR performs the exclusive-OR operation between the signal XCK8 and the ground GND. Then, the counter circuit C performs counting of the results (i.e., the H-states) 9 times. The counter value is defined to −12. The result of the excusive-OR operation between the signal XCK8 and the ground GND is 0 (i.e., the L-state) so that no increase/decrease of the counter value due to the 9-time counting of the results of the exclusive-OR operation between the signal XCK8 and the ground GND occurs. Accordingly, data "−12" as a result of a differential processing between a state 15 as the first data signal and a state 3 as the second data signal can be acquired. The counter circuit C outputs the counter value indicative of the differential processing result.

In the above description, the exclusive-OR operation is performed; however, instead of the calculation circuit XOR, a circuit for performing a nonexclusive-OR operation may be arranged and an output of the circuit may be inverted to be input into the calculation circuit AND. However, a configuration of the circuit is not limited to the above-described one.

In the first preferred embodiment of the present invention, the counting of the results of the exclusive-OR operation enables an obtainment of the counter value for each of the states. Further, the exclusive-OR operation is performed in a time divisional manner and results thereof are sequentially input into the counter circuit C. As a result thereof, the number of signal lines to be provided for the purpose of connecting the latch circuit with the encoder circuit can be reduced. For example, if it is considered that the encoder circuit includes the selection circuit MUX, the calculation circuit XOR, the calculation circuit AND, and the counter circuit C of FIG. 2, a combination of 2 signal lines for transmitting an output of a latch circuit D_8 to the selection circuit MUX and a single signal line for transmitting outputs of the latch circuit D_0 through D_8 to the calculation circuit XOR can be used in connecting the latch circuit with the encoder circuit. The number of signal lines can be reduced than the number of signal lines in FIG. 14. Because in FIG. 14, the number of signal lines that connects between the latch circuit 202 and the binarizing circuit 203 is 9. Within the binarizing circuit 203, a circuit including a combination of at least a nonconjunction (NAND) circuit or a nondisjunction (NOR) circuit, and an inverter circuit is arranged for each of the clock signals CK0 through CK8. However, the encoder circuit of FIG. 2 has a more simple circuit configuration. In view of the above, the present invention can reduce the circuit size of the A/D converter circuit.

Second Preferred embodiment

A second preferred embodiment of the present invention will be described below. FIG. 5 illustrates an example of a data processing method in accordance with the second preferred embodiment of the present invention. A description is made below with reference to FIG. 5. A description is made provided that the annulus ring delay circuit that realizes the data processing method illustrated in FIG. 5 has a configuration identical to that of the annulus ring delay circuit 201 illustrated in FIG. 14. However, the configuration of the annulus ring delay circuit is not necessarily limited to the above-described configuration.

"(1)" of FIG. 5 illustrates a logic state (i.e., a logic state of each of the data signals) of each of the states (i.e., the states 0 through 17) of the clock signals (CK0 through CK8) of the predetermined number (i.e., 9 in this case) as the outputs of the annulus ring delay circuit. A signal XCK* is a signal that a logic state of CK* (* can be replaced with any one of 0, 2, 4, or 6) is inverted.

"(2)" of FIG. 5 illustrates a logic state of a signal XCK8, i.e., an inverted signal of the main latch signal CK8.

"(3)" of FIG. 5 illustrates results of the exclusive-OR operation between the signal XCK8 and the latch signal other than the signal XCK8 or inverted latch signals XCK0, CK1, XCK 2, CK3, XCK4, CK5, XCK6 or CK7.

"(3)'" of FIG. 5 illustrates counter values obtained by performing counting of the results of the exclusive-OR operation in "(3)" (i.e., the number of H-states in this case). These counter values are different from each other in every state (i.e., any one of 0 through 8) in each of the first-half states (i.e., the states 0 through 8) and the last-half states (i.e., the states 9 through 17) of the data signals.

"(4)" of FIG. 5 illustrates the results of the exclusive-OR operation performed between the signal XCK8 and the ground GND (i.e., the L-state).

"(4)'" of FIG. 5 illustrates counter values obtained by performing counting of the predetermined number (i.e., 9 times in this case) of results (i.e., the number of H-states in this case) of the exclusive-OR operation in "(4)". This means that an operation of the state (i.e., the H/L state) of the (inverted) main latch signal in each of the states (i.e., in each of the states 0 through 17) results in searching which state the data signal is in the first-half states (i.e., the states 0 through 8) or in the last-half states (i.e., the states 9 through 17). The counter values become 0 in a case where the data signals are in the first-half states (i.e., the states 0 through 8), whereas, the counter values become 9 in a case where the data signals are in the last-half states (i.e., the states 9 through 17).

"(5)" of FIG. 5 illustrates counter values of the sum of the counter values in "(3)'" and the counter values in "(4)'". In FIG. 5, a case that the counting is performed with the up-count mode is illustrated. For example, the counter value becomes 0 in a case where the state is 0 and the counter value becomes 17 in a case where the state is 17.

As described above, each of the counter values of "(5)" becomes a unique value for each of the states 0 through 17. Here, with respect to the states 0 through 8, since the results of the exclusive-OR operation are 0, the counter values of "(5)" are equivalent to the counter values of "(3)'". More specifically, with respect to the states 0 through 8, outputting of the counter values in "(5)" is equivalent to outputting of the counter values in "(3)".

Figure 6:
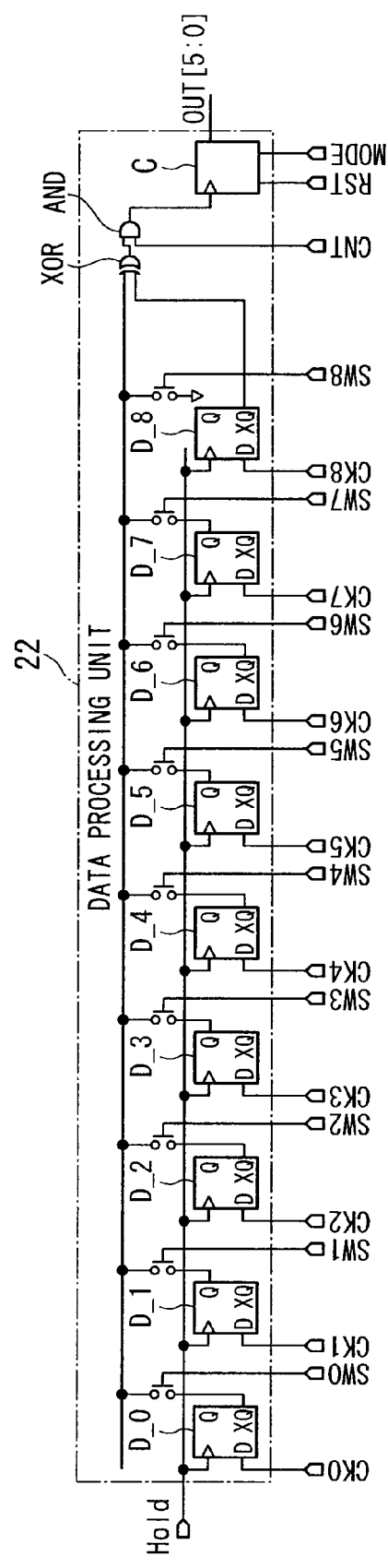
FIG. 6 is a block diagram illustrating a configuration of the data processing unit in accordance with the second preferred embodiment of the present invention.

FIG. 6 illustrates an example of a specific circuit configuration for realizing the data processing method of FIG. 5. The circuit configuration of the second preferred embodiment of the present invention will be described below.

A data processing unit 22 illustrated in FIG. 6 binarizes a data signal as a clock signal output from the annulus ring delay circuit. The data processing unit 22 includes a latch circuits D_0 through D_8 for latching a predetermined number of clock signals CK0 through CK8 that are output from the annulus ring delay circuit, a calculation circuit XOR for performing an exclusive-OR operation, a calculation circuit AND for performing an AND operation that performs counting of results of the exclusive-OR operation, and a counter circuit C capable of performing the counting with both modes such as an up-count mode and a down-count mode.

The most significant bit (MSB) of a counter circuit C is a flag bit for determining a positive state or a negative state. A control signal Hold to be input into each of the latch circuits D_0 through D_8 latches a logic state of each of the clock signals CK0 through CK8 at the moment when a predetermined condition is satisfied. Control signals SW0 through SW8 of a switch output either one of outputs Q/XQ of the latch circuits D_0 through D_7 and a ground GND to one of the input terminals of the calculation circuit XOR. A control signal RST of the counter circuit C resets the counter circuit C. A control signal MODE switches an operation mode of the counter circuit C. A control signal CNT of the calculation circuit AND controls a counting operation of the counter circuit C. Accordingly, counter values can be obtained based on the states (i.e., based on the states 0 through 17) of the data signals. In a case where a user switches the operation mode, in order to avoid the (possible) discontinuity (i.e., destruction) of data that occurs upon switching the operation mode, it is preferable that the counter circuit includes, for example, the data storage function.

Figure 7:
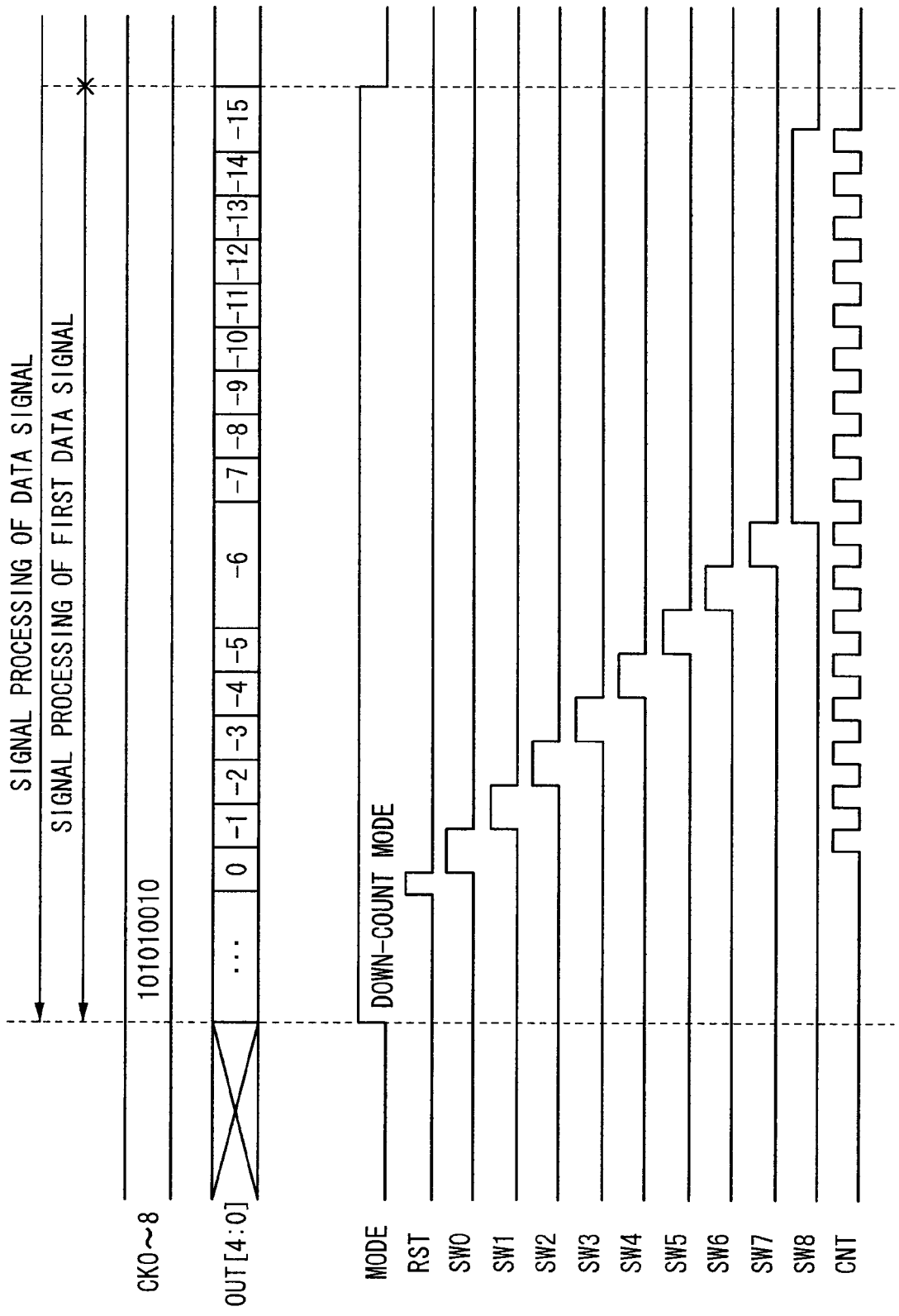
FIG. 7 is a timing chart illustrating an operation of the data processing unit in accordance with the second preferred embodiment of the present invention.
Figure 8:
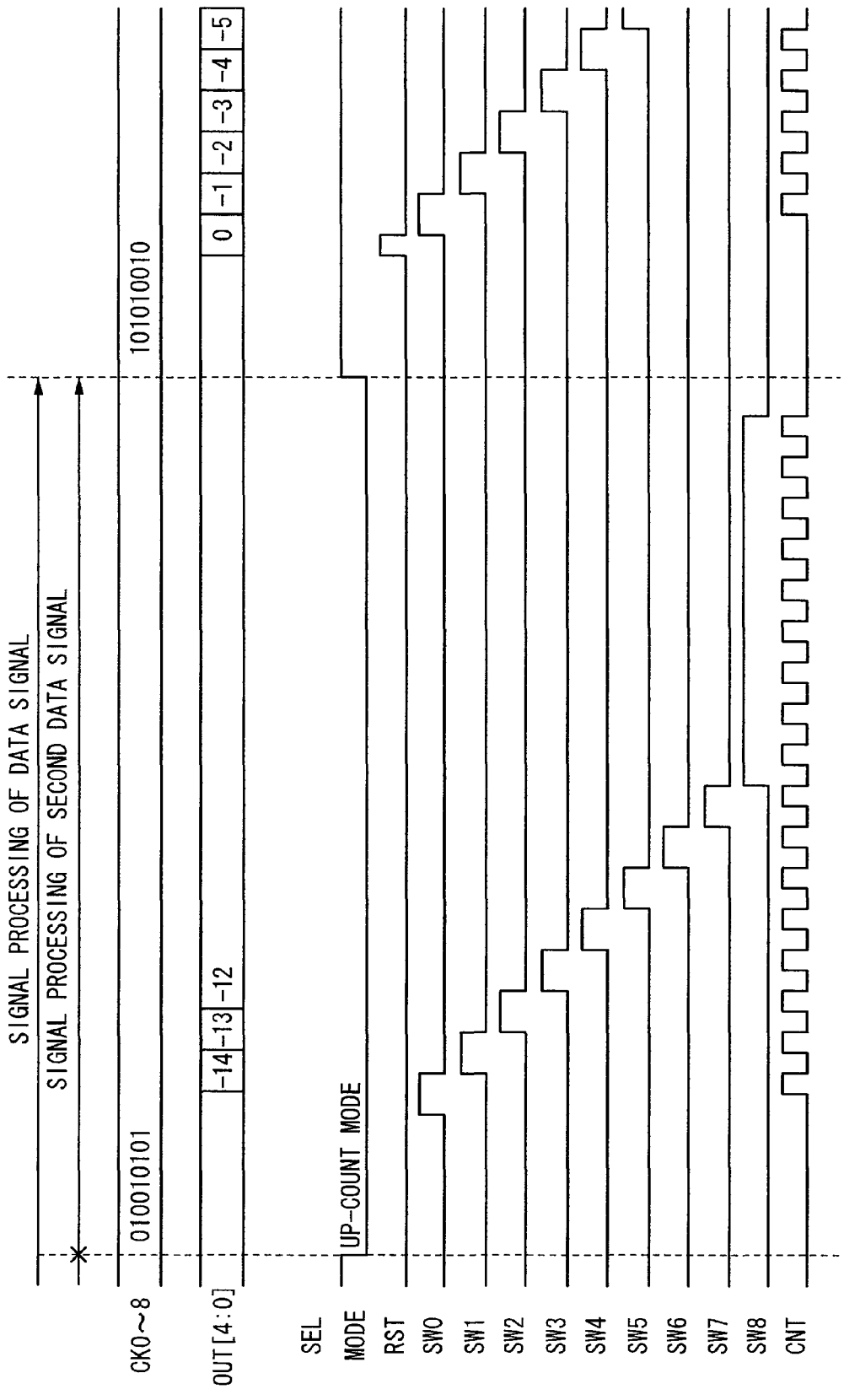
FIG. 8 is a timing chart illustrating another operation of the data processing unit in accordance with the second preferred embodiment of the present invention.

A specific example of an operation of the data processing unit 22 will be described below. The first data signal is set to a state 15 and the second data signal is set to a state 3. In the first data signal, XCK0: L-state/CK1: L-state/XCK2: L-state/ CK3: L-state/XCK4: L-state/CK5: L-state/XCK6: H-state/ CK7: H-state/XCK8: H-state. In the second data signal, XCK0: H-state/CK1: H-state/XCK2: H-state/CK3: L-state/ XCK4: L-state/CK5: L-state/XCK6: L-state/CK7: L-state/ XCK8: L-state. FIGS. 7 and 8, respectively, illustrate an operation of the data processing unit 22. Initially, an operation illustrated in FIG. 7 is performed, followed by an operation illustrated FIG. 8. Before the following operation is performed, the control signal Hold latches the logic states of the clock signals CK0 through CK8 in the latch circuits D_0 through D_8 in the form of data signals.

Now, the first data signal is processed. Initially, a control signal MODE is set to an H-state. Accordingly, the counter circuit C performs counting with the down-count mode. Subsequently, the control signal RST is set to an H-state. Accordingly, the counter value of the counter circuit C is reset to 0. Subsequently, the control signals SW0 through SW7 are sequentially turned ON. The calculation circuit XOR performs the exclusive-OR operation between the signal XCK8 that is the inverted main latch signal and the signals XCK0, CK1, XCK2, CK3, XCK4, CK5, XCK6, and CK7, respectively. The counter circuit C performs counting of the results (i.e., the number of H-states). The counter value at this moment is −6.

Then, the control signal SW8 is turned ON. The calculation circuit XOR performs the exclusive-OR operation between the signal XCK8 and the ground GND. The counter circuit C performs counting of the results (i.e., H-states) for 9 times. The counter value at the moment is −15. In a case where only the first data signal is processed, the counter value at this moment is output from the counter circuit C.

Now, the second data signal is processed. Initially, the control signal MODE is set to an L-state. Accordingly, the counter circuit C performs the counting with the up-count mode. Since the control signal RST performs no reset operation, an initial value of the counter value of the counter circuit C is left to −15. The control signals SW0 through SW7 are sequentially turned ON. The calculation circuit XOR performs the exclusive-OR operation between the signal XCK8 that is the inverted main latch signal and the signals XCK0, CK1, XCK2, CK3, XCK4, CK5, XCK6, and CK7, respectively. The counter circuit C performs counting of the results (i.e., the number of H-states). The counter value at this moment is −12.

Then, the control signal SW8 is turned ON. The calculation circuit XOR performs the exclusive-OR operation between the signal XCK8 and the ground GND. The counter circuit C performs counting of the results (i.e., the H-states) for 9 times. The counter value is defined as −12. A result of the exclusive-OR operation between the signal XCK8 and the ground GND is 0 (i.e., the L-state), so that there is no increase/decrease of the counter value caused due to the counting of the results of the excusive-OR operation between the signal XCK8 and the ground GND 9 times.

As described above, a difference data 12 between the state 15 as the first data signal and the state 3 as the second data signal can be acquired. The counter circuit C outputs the counter value indicating the differential processing result.

In the above description, the exclusive-OR operation is performed between the signal XCK8 that is an inverted main latch signal and the other signals. However, the exclusive-OR operation may be performed between the main latch signal CK8, without inverting the main latch signal CK8, and the other signals. Further, in the above description, the exclusive-OR operation is performed. However, a circuit for performing a nonexclusive-OR operation (XNOR) is arranged instead of the calculation circuit XOR and the output of the circuit is inverted to be input into the calculation circuit AND. The configuration is not necessarily limited thereto.

In the above-described first preferred embodiment of the present invention, with respect to the clock signals CK1, CK3, CK5, and CK7 that are output from the odd numbered inverting elements, the exclusive-OR operation is performed with the signal XCK8 that is the inverted main latch signal, whereas, with respect to the clock signals CK0, CK2, CK4, and CK6 that are output from the even numbered inverting elements, the exclusive-OR operation is performed with the main latch signal CK8. As described above, the output of the latch circuit D_8 is required to be switched, so that the selection circuit MUX is provided in a manner as illustrated in FIG. 2.

On the other hands, in the second preferred embodiment of the present invention, since the exclusive-OR operation is performed between the clock signals CK1, CK3, CK5, and CK7 that are output from the odd numbered inverting elements and the clock signals XCK0, XCK2, XCK4, and XCK6 that are inverted clock signals output from the even numbered inverting elements and the signal XCK8 that is the inverted main latch signal, no switching of the output of the latch circuit D_8 is required. Therefore, the selection circuit MUX illustrated in FIG. 2 is no longer required. That is, the circuit size of the A/D converter circuit can be reduced more than the circuit size of the first preferred embodiment of the present invention.

Third Preferred embodiment

Figure 9:
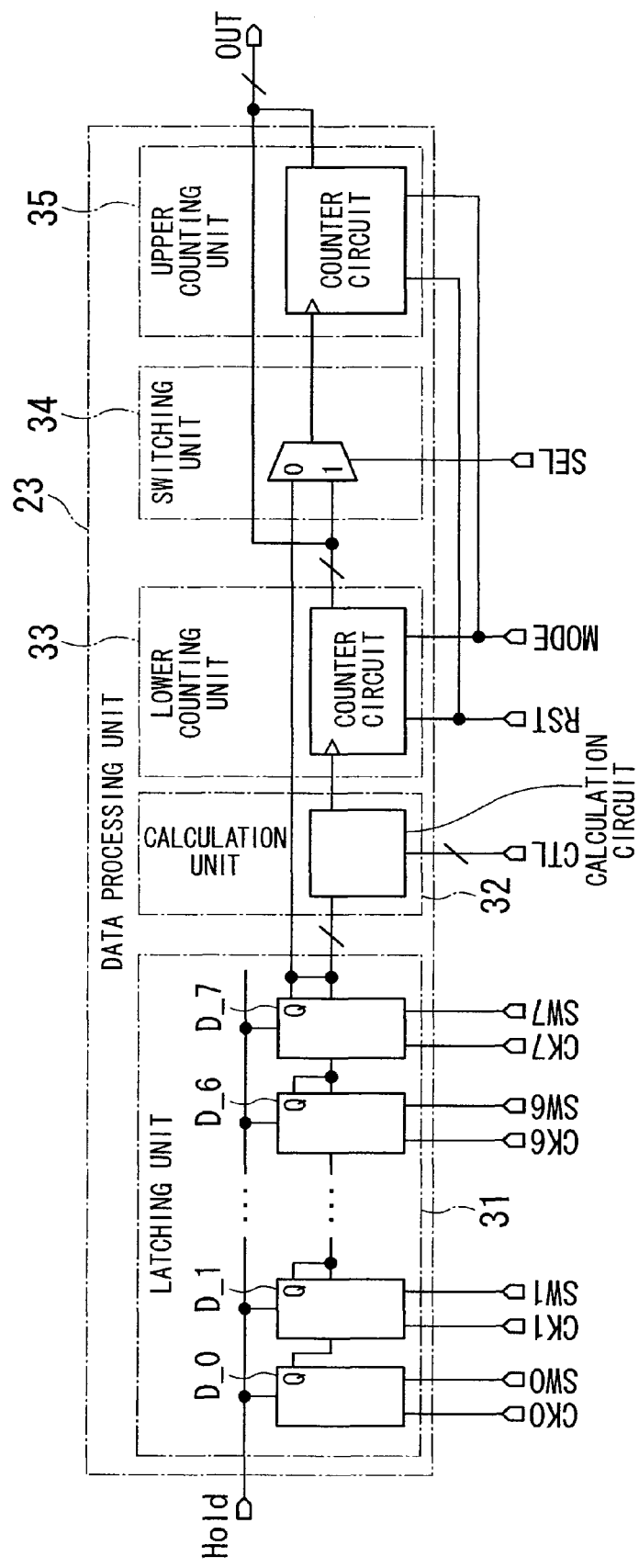
FIG. 9 is a block diagram illustrating a configuration of a data processing unit in accordance with a third preferred embodiment of the present invention.

A third preferred embodiment of the present invention will be described below. FIG. 9 illustrates an example of a specific circuit configuration for realizing a data processing method in accordance with the third preferred embodiment of the present invention. A configuration of the third preferred embodiment of the present invention will be described below. A delay circuit for realizing the data processing method in accordance with the third preferred embodiment of the present invention may not be the annulus ring delay circuit including the inverting elements that are connected so as to form a ring shape.

A data processing unit 23 illustrated in FIG. 9 includes a latching unit 31 for latching a predetermined number of clock signals CK0 through CK7 that are output from the delay circuit, a calculation unit 32 for calculating the outputs of the latching unit 31, a lower counting unit 33 for performing counting based on a calculation result by the calculation unit 32, a switching unit 34 for switching outputs of the latching unit 31 and the lower counting unit 33, and an upper counting unit 35 for performing counting of an output from the switching unit 34 as a count clock. A preferable predetermined number of the clock signals of the third preferred embodiment of the present invention (e.g., 8 in FIG. 9) is a power-of-two.

The lower counting unit 33 and the upper counting unit 35, respectively, include an up-down counter circuit having an up-down count mode. The control signal RST performs a reset operation and the control signal MODE performs switching of the count modes. The MSB of the counter circuit included in the upper counting unit 35 is a flag bit for determining a positive state or a negative state. Further, in order to avoid the discontinuity (i.e., destruction) of data that may occur at the moment of switching of the above-described count modes and the below described count clocks, the lower counting unit 33 and the upper counting unit 35, respectively, preferably include a counter circuit having, for example, a data storage function. The latching unit 31 includes the latch circuits D_0 through D_7 and latches the logic states of the clock signals CK0 through CK7 at a predetermined time based on the control signal Hold. The control signals SW0 through SW7, respectively, output predetermined data to the calculation unit 32 from the latched signals. The control signal CTL controls the counting performed by the calculation unit 32 and the lower counting unit 33. The switching unit 34 performs switching of the count clocks by using the control signal SEL.

Figure 10:
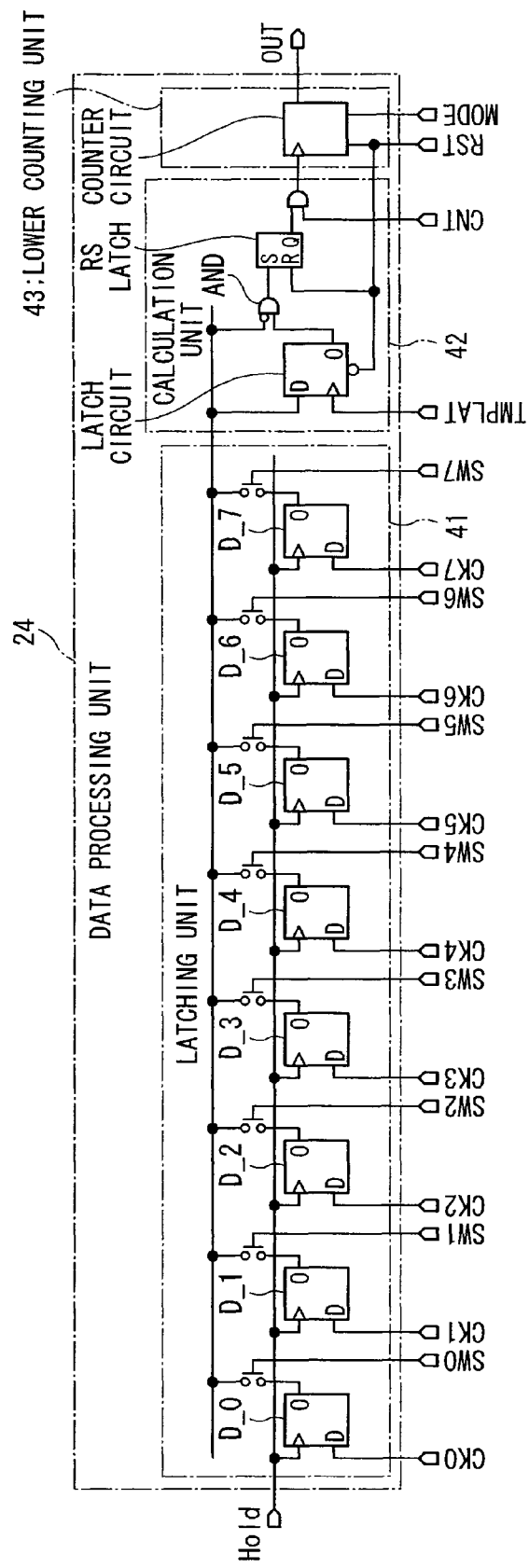
FIG. 10 is a block diagram illustrating another configuration of the data processing unit in accordance with the third preferred embodiment of the present invention.
Figure 11:
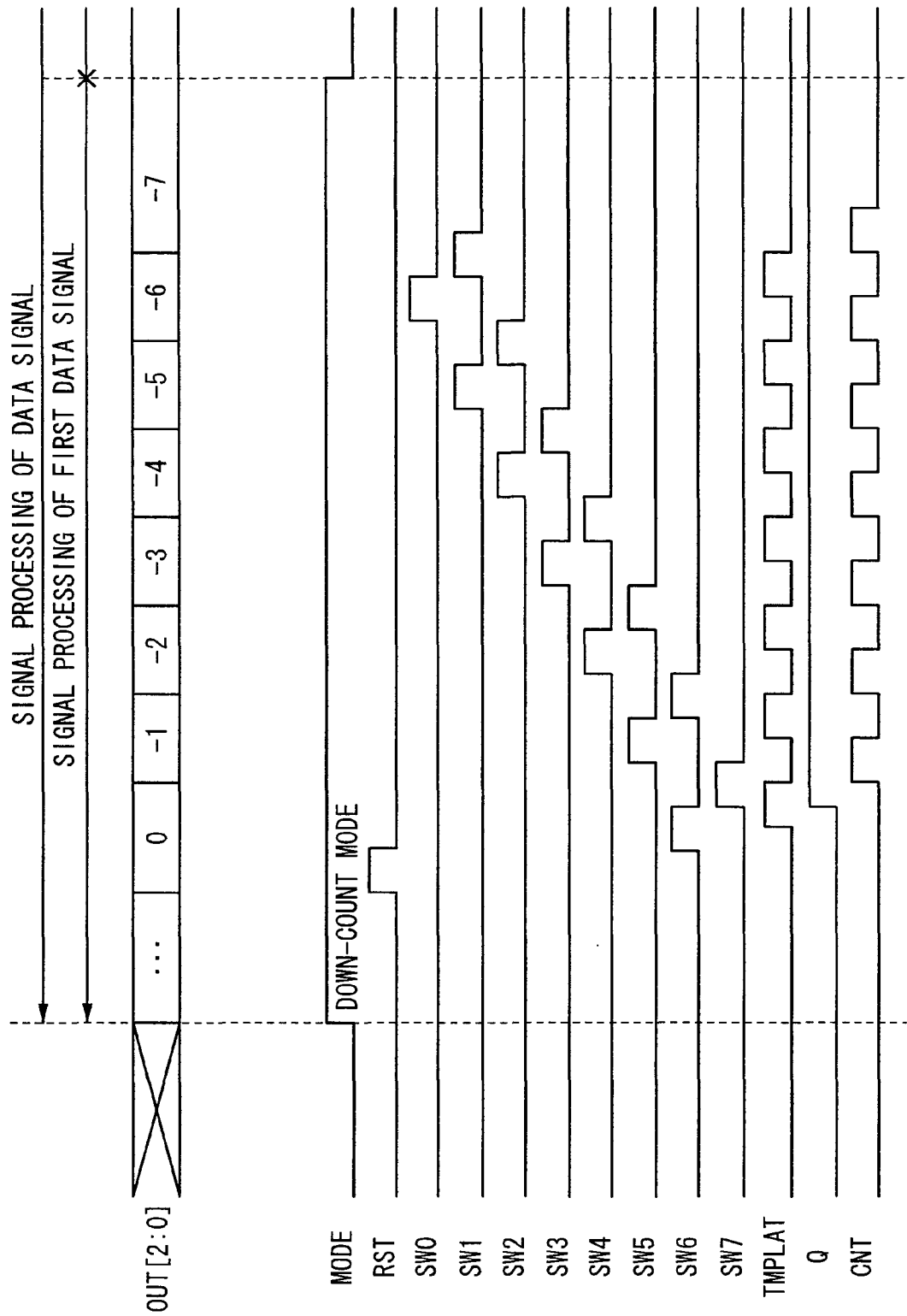
FIG. 11 is a timing chart illustrating an operation of the data processing unit in accordance with to the third preferred embodiment of the present invention.
Figure 12:
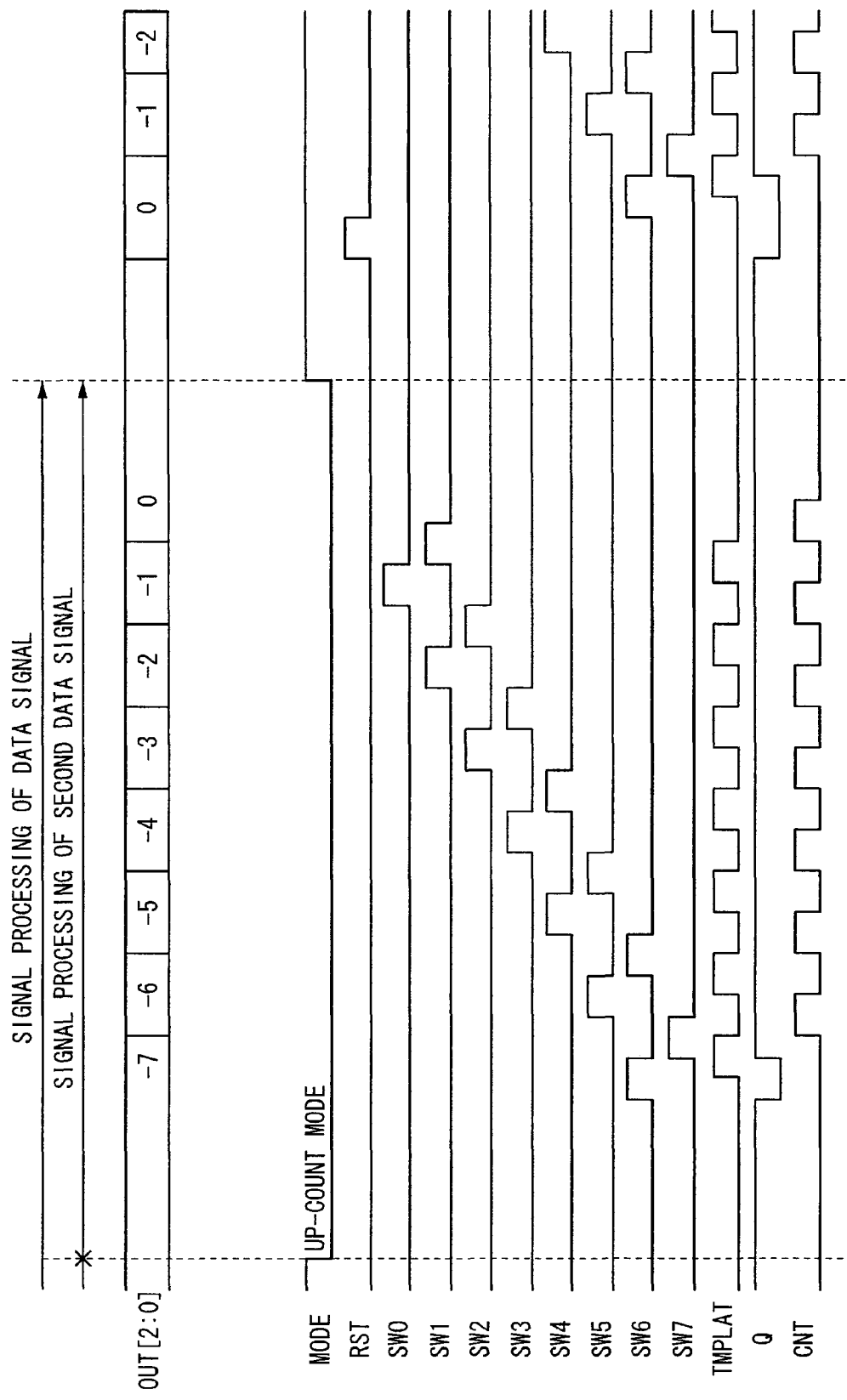
FIG. 12 is a timing chart illustrating another operation of the data processing unit in accordance with the third preferred embodiment of the present invention.

Binarization of the lower data signal may be performed by using the method, for example, in accordance with the first preferred embodiment or the second preferred embodiment of the present invention. Alternatively, the binarization of the lower data signal may be performed by using a method for obtaining a thermocode as, for example, illustrated in FIGS. 10, 11, and 12. In other words, a configuration of the circuit including the latching unit 31, the calculation unit 32, and the lower counting unit 33 may be any one of the configurations illustrated in FIG. 2, 6, or 10. However, the configuration is not necessarily limited to them.

In the present configuration, the lower counting unit in a case where the method in accordance with the first preferred embodiment or the second preferred embodiment of the present invention is used includes a 4-bit counter circuit. The lower counting unit that uses the method for obtaining the thermocode includes a 3-bit counter circuit.

An operation of the data processing unit 23 will be described with reference to a specific example. The present description is made by exemplifying a case of using the 4-bit counter circuit (e.g., the method in accordance with the first preferred embodiment or the second preferred embodiment of the present invention) as the lower counting unit 33. The number of states of the lower data signals based on the 8 clock signals output from the delay circuit is 16 (i.e., the states 0 through 15). In a case where the counting is performed with the up-count mode, if the state is, for example, 0, the counter value is also 0 and, if the state is, for example, 15, the counter value is also 15. In a case where the counting is performed with the down-count mode will be described. When the state is 0, the counter value is 0. When the state is 15, the counter value is −15.

An example of performing differential processing between the first data signal and the second data signal will be described below. Each of the data signals includes the lower data signal and the upper data signal. It is provided that the lower data signal of the first data signal is in state 15 and the upper data signal of the first data signal is in state 3, and further provided that the lower data signal of the second data signal is in state 3 and the upper data signal of the second data signal is in state 5. In other words, the first data signal corresponds to 63 (=15+16×3) and the second data signal corresponds to 83 (=3+16×5).

Initially, the control signal MODE sets the count mode to the down-count mode.

Subsequently, the control signal RST resets the counter values of the lower counting unit 33 and the upper counting unit 35. The counter value at the moment is 0. The control signal SEL is set to an L-state. The count clock of the upper counting unit 35 is set to an output of the latch circuit D_7 of the latching unit 31. While the delay circuit is operated, the clock signal CK7 is input into the upper counting unit 35 through the latch circuit D_7 and the switching unit 34. The upper counting unit 35 performs counting of the clock signal CK7 as the count clock.

A first data signal as a data signal at the moment is held at the first time point at which a predetermined condition is satisfied. At this time point, each of the states that are held in the corresponding latch circuits D_0 through D_7 based on the control signal Hold corresponds to the lower data signal. A result of counting performed by the upper counting unit 35 before the first time point corresponds to the upper data signal. At this time point, a counter value based on the values held by the lower counting unit 33 and the upper counting unit 35 is −48 (=−16×3) based on the counting result of the upper counting unit 35.

Subsequently, the control signal SEL is set to an H-state. Accordingly, the count clock of the upper counting unit 35 is switched to the output of the lower counting unit 33 and thereby a down-counter circuit in which the lower counting unit 33 and the upper counting unit 35 are connected to each other is formed. Then, the lower data signal is subjected to the binarization processing. In this binarization processing, the lower counting unit 33 outputs a clock signal to the upper counting unit 35 every time the counter value becomes a predetermined value and the upper counting unit 35 performs a single count-down based on the clock signal. In this example, when the counter value counted by the lower counting unit 33 is switched from 0 to −1 (equivalent to 15), the clock signal is output to the upper counting unit 35. At the moment the binarization processing of the lower data signal ends, the counter value based on the values held by the lower counting unit 33 and the upper counting unit 35 is −63. Accordingly, binary encoded data based on the first data signal can be acquired.

Subsequently, the control signal SEL is set to an L-state. Accordingly, the count clock of the upper counting unit 35 is switched to the output of the latch circuit D_7 of the latching unit 31. At the same time, the control signal MODE sets the count mode to the up-count mode. No reset operation is performed here with respect to the lower counting unit 33 and the upper counting unit 35. The counter value at the moment is kept as −63. While the delay circuit is in operation, the clock signal CK7 is input into the upper counting unit 35 through the latch circuit D_7 and the switching unit 34. The upper counting unit 35 performs counting of the clock signal CK7 as the count clock.

At the second time point at which a predetermined condition is satisfied, the second data signal as a data signal at the moment is held. At the moment, the states that the control signal Hold holds in the latch circuits D_0 through D_7 correspond to the lower data signal. A result that the upper counting unit 35 performs the counting between the first time point and the second time point corresponds to the upper data signal. At the moment, the counter value based on the values held by the lower counting unit 33 and the upper counting unit 35 is 17 (=−63+16×5).

Subsequently, the control signal SEL is set to an H-state. Accordingly, the count clock of the upper counting unit 35 is switched to the output of the lower counting unit 33 to form an up-counter circuit to which the lower counting unit 33 and the upper counting unit 35 are connected. Subsequently, the lower data signal is subjected to the binarization processing. In this binarization processing, the lower counting unit 33 outputs the clock signal to the upper counting unit 35 every time the counter value comes to be a predetermined value. The upper counting unit 35 performs the counting by a single count-up based on the clock signal. In this example, when the counter value counted by the lower counting unit 33 is switched from −1 (equivalent to 15) to 0, the clock signal is output to the upper counting unit 35. At the moment at which the binarization processing of the lower data signal ends, the counter value based on the values held by the lower counting unit 33 and the upper counting unit 35 is 20. Accordingly, binary encoded data based on the difference data between the first data signal and the second data signal can be acquired.

The lower counting unit 33 outputs lower data included in the binary encoded data. The upper counting unit 35 outputs upper data included in the binary encoded data.

Figure 14:
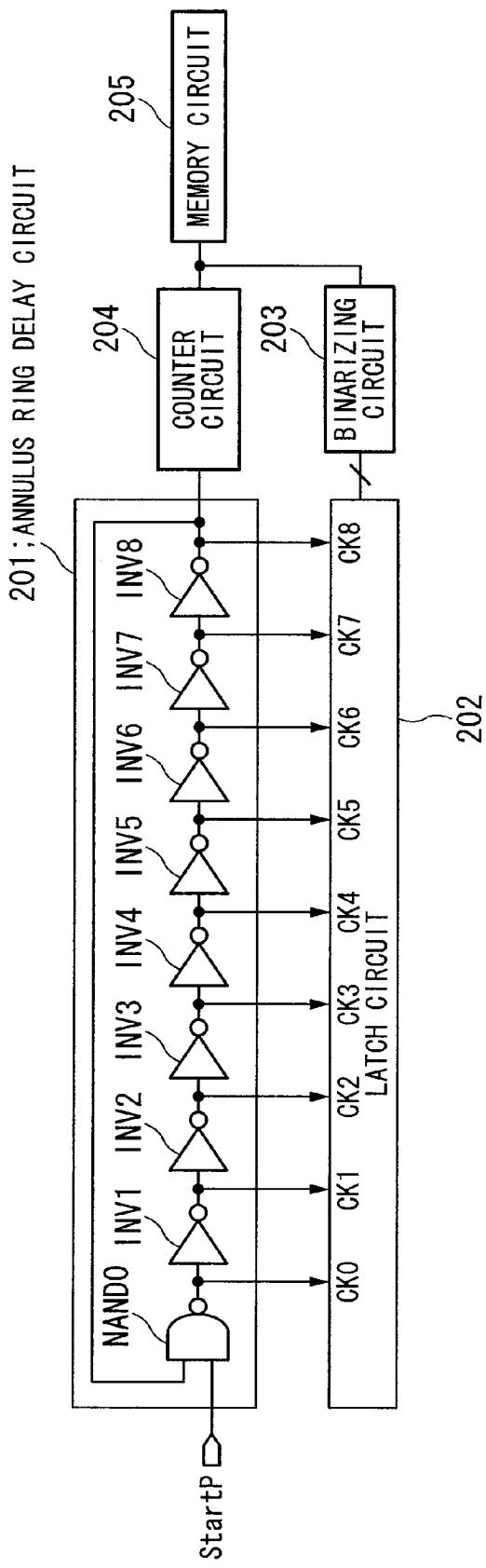
Figure 15:
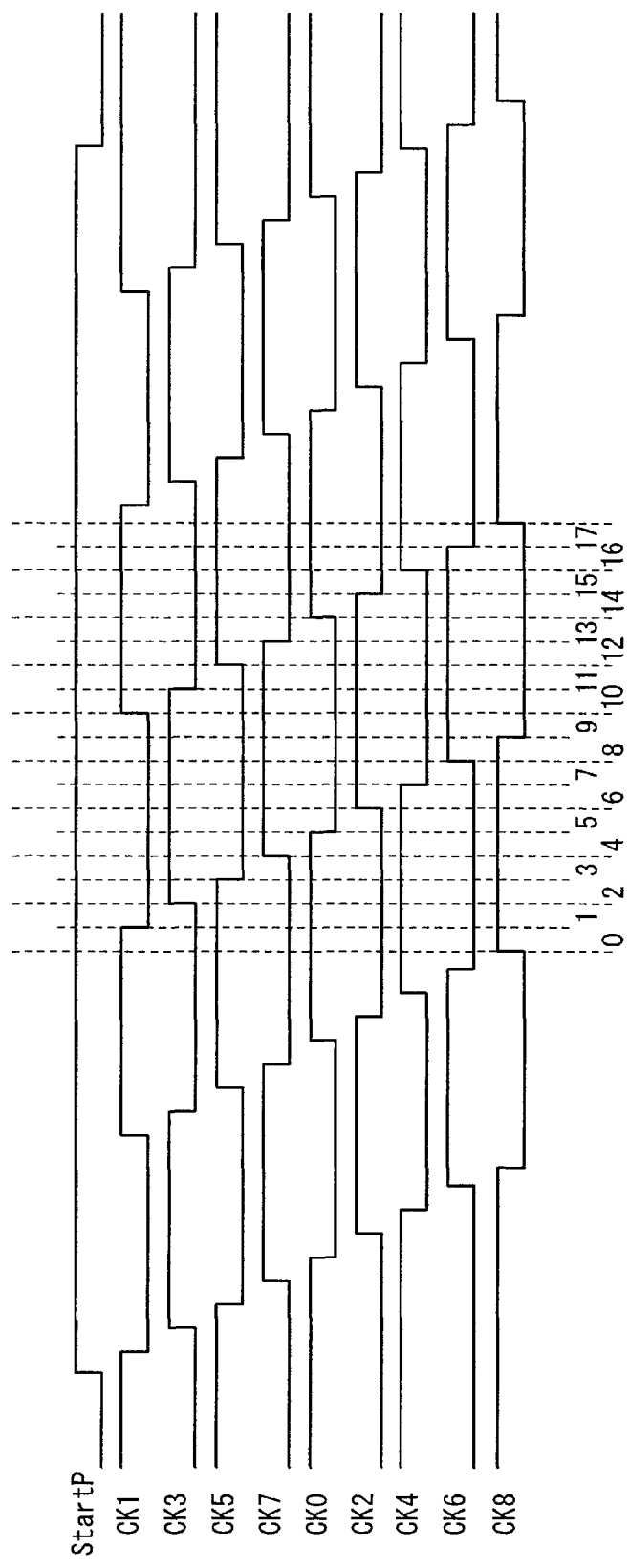
FIG. 15 is a timing chart illustrating the operation of the data processing unit in accordance with the related art.

In the third preferred embodiment of the present invention, the switching unit 34 and the upper counting unit 35 are added to the configuration of the data processing unit described in, for example, the first preferred embodiment and the second preferred embodiment of the present invention. However, since only the minimum configuration is added and thus just a single line for connecting the latch circuit D_7 with the switching unit 34 is added in order to connect the latching unit 31 with the encoder circuit, a circuit size of the A/D converter circuit can be reduced more than the case where the encoder circuit illustrated in FIG. 14 is used.

Fourth Preferred embodiment

Figure 13:
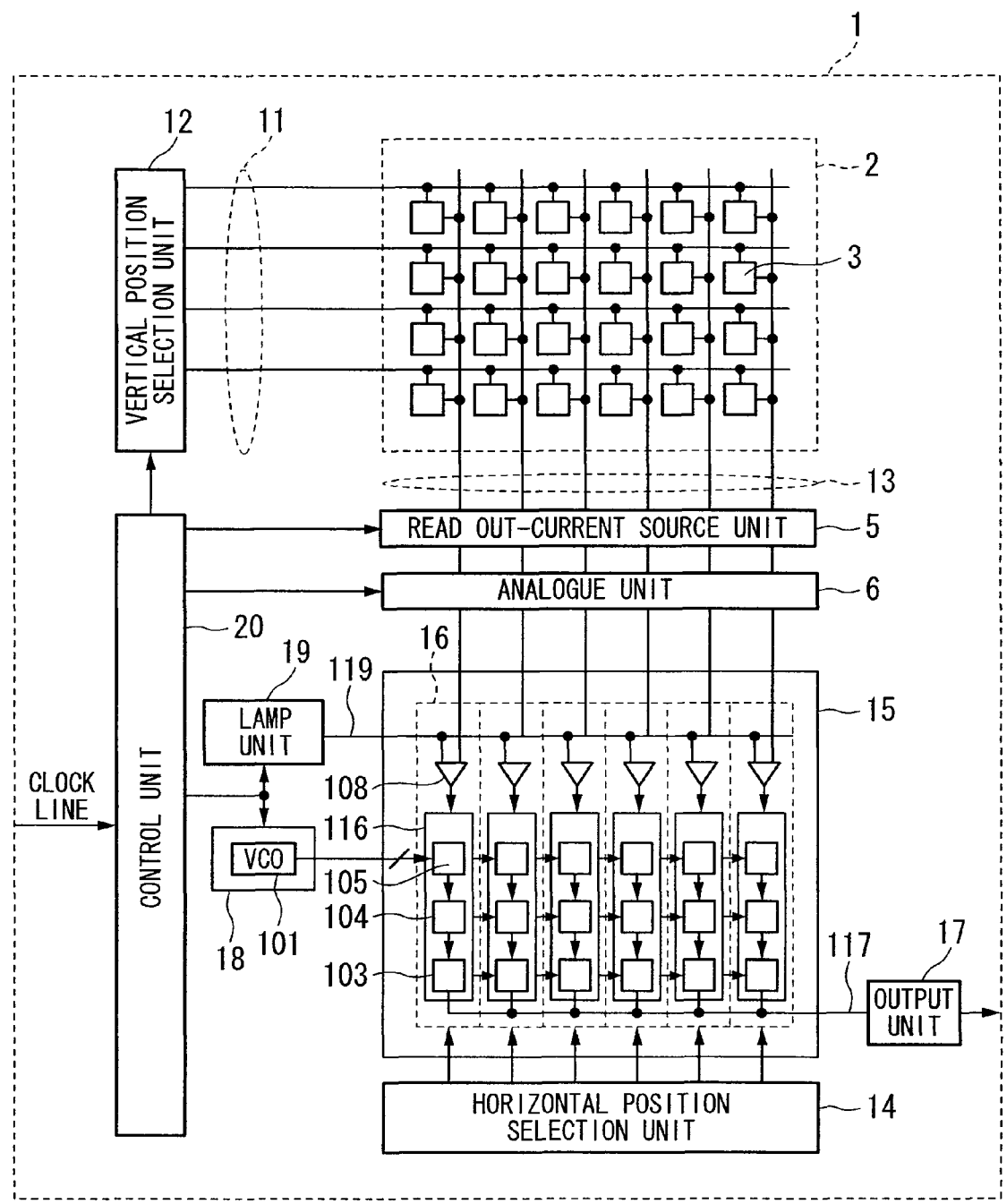
FIG. 13 is a block diagram illustrating a configuration of a solid-state image pickup device in accordance with a fourth preferred embodiment of the present invention.

A fourth preferred embodiment of the present invention will be described below. FIG. 13 illustrates an example of a schematic configuration of the (C) MOS solid-state image pickup device in accordance with the fourth preferred embodiment of the present invention. A solid-state image pickup device 1 illustrated in FIG. 13 includes an image capturing unit 2, a vertical position selection unit 12, a read out-current source unit 5, an analogue unit 6, a clock generation unit 18, a ramp unit 19 (i.e., a reference signal generation unit), a column processing unit 15, a horizontal position selection unit 14, an output unit 17, and a control unit 20.

The image capturing unit 2 includes a plurality of unit pixels 3 for generating and outputting signals based on the amount of incident electromagnetic wave. The plurality of the unit pixels 3 are arranged in matrix. The vertical position selection unit 12 selects each of the rows of the image capturing unit 2. The read out-current source unit 5 reads out a signal from the image capturing unit 2 as a voltage signal. The analogue unit 6 includes an Auto Gain Control (AGC) circuit or the like having, as required, a signal amplification function although a detailed description of the analogue unit 6 is omitted here. The clock generation unit 18 generates each of the clocks. The ramp unit 19 generates a reference signal (i.e., a ramp wave) that increases or decreases as time advances. The column processing unit 15 is connected to the ramp unit 19 through a reference signal line 119. The horizontal position selection unit 14 reads out the A/D converted data and outputs the data to a horizontal signal line 117. The output unit 17 is connected to the horizontal signal line 117. The control unit 20 controls each of the units.

In FIG. 13, a case of the image capturing unit 2 including the unit pixels 3 of 4 rows×6 columns is described for the sake of simple description. Actually, however, several tens of or several tens of thousands of unit pixels 3 are arranged in each row and each column of the image capturing unit 2. Although illustration thereof is omitted here, the unit pixels 3 included in the image capturing unit 2 includes a photoelectric conversion element such as a photodiode, a photogate, and a phototransister and a transistor circuit.

In this system configuration, a peripheral driving system and a peripheral signal processing system for drive-controlling each of the unit pixels 3 of the image capturing unit 2, i.e., peripheral circuits such as the vertical position selection unit 12, the horizontal position selection unit 14, the column processing unit 15, the output unit 17, the clock generation unit 18, the ramp unit 19, and the control unit 20, are integrally formed in a semiconductor area made of a single crystal silicon, together with the image capturing unit 2, by using a technique similar to a technique for manufacturing a semiconductor integrated circuit.

Each of the units will be described in more detail. In the image capturing unit 2, the unit pixels 3 are arranged two-dimensionally by 4 rows×6 columns as well as row control lines 11 are wired to this 4-row×6-column pixel arrangement. Each of the ends of the row control lines 11 is connected to each of the output terminals corresponding to each of the columns of the vertical position selection unit 12. The vertical position selection unit 12 includes a shift resister or a decoder and, upon driving each of the unit pixels 3 of the image capturing unit 2, controls row addresses and row scanning of the image capturing unit 2 through the row control lines 11. Further, vertical signal lines 13 are wired to each of the columns, respectively, with respect to the pixel arrangement of the image capturing unit 2.

The read out-current source unit 5 reads out a signal from the image capturing unit 2 as a voltage signal.

The column processing unit 15 includes ADC units 16 provided for, for example, each of the rows of pixels of the image capturing unit 2, i.e., for each of the vertical signal lines 13. The column processing unit 15 converts an analogue pixel signal read out through each of the vertical signal lines 13 for each of the rows of pixels from each of the unit pixels 3 of the image capturing unit 2 into digital data. In the fourth preferred embodiment of the present invention, the ADC units 16 are arranged with a relationship of one for one with respect to the rows of pixels of the image capturing unit 2. However, this is a mere example, and the relationship therebetween is not limited to the above-described arrangement. The following configuration is also employable. That is, for example, a single ADC unit 16 is arranged with respect to the plurality of rows of pixels and this single ADC unit 16 is used in a time-shared manner between the plurality of rows of pixels. The column processing unit 15 is included, together with the below described ramp unit 19 and the clock generation unit 18, in an analogue-digital conversion unit for converting analogue pixel signals read out from the unit pixels 3 of a selected pixel row of the image capturing unit 2 into digital pixel data. This column processing unit 15, more specifically, the ADC units 16, is/are described below in detail.

The ramp unit 19 includes, for example, an integrating circuit. The ramp unit 19 generates a so-called ramp wave of which level increasingly/decreasingly changes as time advances based on a control by the control unit 20. The ramp unit 19, then, supplies thus generated ramp wave to one of input terminals of each of voltage comparing units 108 through a reference signal line 119. The ramp unit 19 is not limited to the one using the integrating circuit but may be the one using the DAC circuit. However, in a case where the ramp wave is digitally generated by using the DAC circuit, such a configuration is required so that the ramp wave is to be made into finer steps or produces an equivalent effect.

The horizontal position selection unit 14 includes a shift resister or a decoder. The horizontal position selection unit 14 controls the column addresses or the scanning of the columns of the ADC unit 16 of the column processing unit 15. According to this control performed by the horizontal position selection unit 14, the digital data after AD-converted by the ADC units 16 are sequentially read out and output to the horizontal signal line 117.

The clock generation unit 18 includes a VCO101 as the delay circuit to which the delay unit (i.e., the inverting elements) is connected. For example, if 8 delay units (all having the same configurations) included in the VCO101 as lower bits are connected to the clock generation unit 18, the VCO101 outputs 8-phase clocks CK0, CK1, CK2, CK3, Ck4, CK5, CK6, and CK7. The delay circuit included in the VCO101 may be an annulus ring delay circuit including the plurality of inverting elements that are connected to each other so as to form a ring shape.

The output unit 17 outputs binarized digital data. Further, the output unit 17 may include therein, for example, signal processing functions such as a black level adjustment function, a column variation correction function, and a color processing function, in addition to a buffering function. Still further, the output unit 17 may convert n-bit parallel digital data into serial data and output the converted serial data.

The control unit 20 includes a function block of a Timing Generator (TG) for supplying a clock signal and a pulse signal of a predetermined timing that are required for an operation of each of the ramp unit 19, the clock generation unit 18, the vertical position selection unit 12, the horizontal position selection unit 14, and the output unit 17 and a function block for establishing a communication with this TG. The control unit 20 may be provided as a separate semiconductor integrated circuit independent from the other functional elements such as the image capturing unit 2, the vertical position selection unit 12, and the horizontal position selection unit 14. In that case, a combination of an image capture apparatus including the image capturing unit 2, the vertical position selection unit 12, the horizontal position selection unit 14, and the like and the control unit 20 forms an image capture apparatus as an example of the semiconductor system. This image capture apparatus may be provided in the form of an image capture module in which peripheral signal processing devices and a power source circuit are installed.

A configuration of each of the ADC units 16 will be described below. The ADC unit 16 compares the analogue pixel signal read out from each of the unit pixels 3 of the image capturing unit 2 through the corresponding vertical signal lines 13 with a ramp wave that is given from the ramp unit 19 for the sake of performing A/D conversion. As a result, the ADC unit 16 generates a pulse signal having a size (i.e., a pulse width) in a time axis direction corresponding to each of sizes of a reset level (i.e., a reference level) and a signal level. Then, the data corresponding to a period of the pulse width of this pulse signal is A/D-converted into digital data corresponding to the size of the pixel signal.

A configuration of each of the ADC units 16 will be described below in detail. The ADC unit 16 is provided for each column and thus 6 ADC units 16 are provided in FIG. 13. Every ADC unit 16 of all of the columns has the same configuration. Each ADC unit 16 includes voltage comparing units 108 and latching units 116 each including a lower latching unit 105, a binarizing circuit 104, and a column counter 103. The assumed column counter 103 here is a counter circuit having a latching function that holds a logic state of the column counter 103. Accordingly, it becomes no more necessary to have an upper latching unit additionally built-in. A lower latching unit 105 corresponds to the latching unit 31 of FIG. 9. The binarizing circuit 104 corresponds to a combination of the calculation unit 32, the lower counting unit 33, and the switching unit 34 of FIG. 9. The column counter 103 corresponds to the upper counting unit 35 of FIG. 9.

Each of the voltage comparing units 108 compares a signal voltage based on the analogue pixel signal output from the corresponding unit pixels 3 of the image capturing unit 2 through the corresponding vertical signal line 13 with the ramp wave output from the ramp unit 19, thereby converting the size of the pixel signal into information in the time axis direction (i.e., the pulse width of the pulse signal). The comparative value output from the voltage comparing unit 108 becomes a High level, for example, when the ramp voltage becomes larger than the signal voltage, whereas the comparative value output from the voltage comparing unit 108 becomes a Low level, for example, when the ramp voltage becomes equal to or smaller than the signal voltage.

Each of the lower latching units 105 receives the comparative value output from the voltage comparing unit 108 and thereby latches (holds/stores) the logic state generated by the clock generation unit 18 in the form of a lower data signal at a timing this output comparative value is inversed. The lower data signal latched by the lower latching unit 105 here is, for example, 8-bit data. Also, the upper data signal based on the counting result of each of the column counters 103 is, for example, 10-bit data. This 10-bit data is a mere example and the upper data signal may be less than 10 bit data (e.g., 8-bit data) or may be more than 10-bit data (e.g., 12-bit data) or the like.

An operation of the fourth preferred embodiment of the present invention will be described below. A detailed description of the operation of the unit pixels 3 is omitted here. However, as it is well known, the reset level and the signal level are output in the unit pixels 3.

The A/D conversion is performed in a manner as described below. For example, the ramp wave that decreases while forming a predetermined decreasing line is compared with a voltage of each of the reset level or the signal level as the pixel signals from the unit pixels 3 and performs the counting by a clock signal output from the VCO101 (e.g., CK7 corresponding to the output Q of the latch circuit D_7 of the latching unit 31 of FIG. 9) in a period between a time at which the ramp wave to be used in this comparison processing is generated and a time at which the signal based on the reset level or the signal level matches the ramp wave (i.e., the ramp voltage) as well as performs measurement of the logic states of a multiphase clock having predetermined phase differences, respectively, (i.e., CK0 through CK7 corresponding to the outputs Q of the latch circuits D_0 through D_7 of the latching unit 31 of FIG. 9), thereby acquiring digital data corresponding to the size of the reset level or the signal level.

A reset level including noise of the pixel signal is read out by a first reading operation, as an analogue pixel signal, from each of the unit pixels 3 of the selected row of the image capturing unit 2. Then, the signal level is read out by a second reading operation. The reset level and the signal level are input into the ADC unit 16 in time series through the vertical signal lines 13. The operation of each of the first reading operation and the second reading operation and the subsequent calculation processing are described below in detail.

First Reading Operation

After a state of the first reading from the unit pixels 3 of a predetermined pixel row to the corresponding vertical signal line 13 becomes stable, the control unit 20 supplies control data for generating the ramp wave to the ramp unit 19. In receiving the control data, the ramp unit 19 outputs a ramp wave, of which the wave form changes based on a ramp shape in its entirety through time, as a comparative voltage to be applied to one of the input terminals of the corresponding voltage comparing unit 108. The voltage comparing unit 108 compares this ramp wave with the reset level. During this time, the corresponding column counter 103 performs counting of the clock signal output from the VCO101 as the count clock. Preferably, a timing at which the clock signal of the VCO101 is begun to be output is about the same time as a timing at which the ramp wave is begun to be output.

Each of the voltage comparing units 108 compares the ramp wave supplied from the ramp unit 19 with the reset level and, when the voltages of the ramp wave and the reset level approximately match to each other (i.e., at a first timing), the comparative output is inverted. At this first timing, each of the lower latching units 105 holds the lower logic state of the VCO101. Further, at this first timing, each of the column counters 103 stops the counting operation in order to hold the upper logic state. As a result thereof, the first data signal is held by the lower latching unit 105 and the column counter 103. The control unit 20 stops a supply of the control data to the ramp unit 19 and an output from the clock generation unit 18 after a predetermined time lapsed. Accordingly, the ramp unit 19 stops generation of the ramp wave.

Thereafter, the first data signal is subjected to the binarization processing based on the method described in the third preferred embodiment of the present invention. Accordingly, digital data based on the first data signal can be acquired. Subsequently, this digital data as an initial value is set to each of the binarizing circuits 104 and each of the column counters 103 in the second reading.

Second Reading Operation

Subsequently, upon the second reading, a signal level in response to an incident light amount per each unit pixels 3 is read out and an operation identical to that of the first reading is performed. After a state of the second reading operation from the unit pixels 3 of a predetermined pixel row to the corresponding vertical signal line 13 becomes stable, the control unit 20 supplies control data for generating the ramp wave to the ramp unit 19. In receiving the control data, the ramp unit 19 outputs a ramp wave, of which wave form changes to a ramp shape in its entirety through time, as the comparative voltage to be applied to one of the input terminals of each of the voltage comparing units 108. Each of the voltage comparing units 108 compares this ramp wave with the signal level. During this period, each of the column counters 103 performs counting of the clock signal output from the VCO101 as the count clock. Preferably, a timing at which the clock signal of the VCO101 is begun to be output is to be at about the same time as a timing at which the ramp wave is begun to be output.

Each of the voltage comparing units 108 compares the ramp wave supplied from the ramp unit 19 with the signal level and, when the voltages almost match to each other (at a second timing), the comparative output is inverted. At this second timing, each of the lower latching units 105 maintains the lower logic state of the VCO101. Further, at this second timing, each of the column counters 103 stops the counting operation thereof, thereby holding the upper logic state thereof. As a result thereof, each of the lower latching units 105 and each of the column counters 103 store a second data signal. The control unit 20 stops supply of control data to the ramp unit 19 and output from the clock generation unit 18 after a predetermined time lapses. Accordingly, the ramp unit 19 stops generation of the ramp wave.

Then, the second data signal is subjected to the binarization processing based on the method described in the third preferred embodiment of the present invention. Accordingly, digital data based on difference data between the first data signal and the second data signal can be acquired. Finally, the digital data is output by the horizontal position selection unit 14 through the horizontal signal line 117 to be transferred to the output unit 17.

Accordingly, the differential processing of the pixel signal can be performed digitally within the columns that are arranged with narrow pitches.

As used herein, the following directional terms "forward, rearward, above, downward, right, left, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," "nearly", and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

The term "unit" is used to describe a component, section or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. A data processing method that performs a differential processing between a first data signal and a second data signal based on an output of a delay circuit, the delay circuit including a plurality of inverting elements that are connected to each other, the data processing method comprising:
   a first data processing on the first data signal, the first data processing comprising:
      counting, by an upper counting unit, one of a plurality of clock signals output from the delay circuit with a first mode, the first mode being either one of a down-count mode and an up-count mode;
      counting, by a lower counting unit, clock signals based on a predetermined number of the plurality of clock signals output from the delay circuit with the first mode, to output a first clock signal to the upper counting unit every time a counter value becomes a first predetermined value; and
      counting, by the upper counting unit, the first clock signal from the lower counting unit with the first mode;
   a second data processing on the second data signal, the second data processing comprising:
      counting, by the upper counting unit, one of the plurality of clock signals output from the delay circuit with a second mode, the second mode being the other one of the either one of the down-count mode and the up-count mode, while the value counted with the first mode is considered as a first initial value;

counting, by the lower counting unit, clock signals based on the predetermined number of the plurality of clock signals output from the delay circuit with the second mode, to output a second clock signal to the upper counting unit every time the counter value becomes a second predetermined value while the value counted with the first mode is considered as a second initial value; and counting, by the upper counting unit, the second clock signal from the lower counting unit with the second mode; and outputting the counter values counted by the upper counting unit and the lower counting unit with the second mode as difference data between the first data signal and the second data signal.

2. The data processing method according to claim 1, further comprising:

performing the counting with the down-count mode and the up-count mode, an up-down counter capable of switching modes being shared between the down-count mode and the up-count mode, a processing mode of the up-down counter being switched to perform the counting.

3. A solid-state image pickup device, comprising:

a image capturing unit comprising a plurality of pixels which output pixel signals based on the amount of incident electromagnetic waves, arranged in a matrix shape;

a reference signal generation unit configured to generate a reference signal that increases or decreases through time;

a comparison unit configured to perform a comparison between the pixel signals output from the pixels and the reference signal, which are to be A/D converted, and ends the comparison at a timing that the reference signal satisfies a predetermined condition with respect to the pixel signal;

a delay circuit having a plurality of inverting elements;

an upper counting unit configured to perform counting of clock signals from the delay circuit;

a lower latching unit configured to latch a predetermined number of clock signals output from the delay circuit at a timing based on the end of the comparison processing; and a lower counting unit configured to perform counting of clock signals based on the predetermined number of the clock signals latched by the lower latching unit, wherein a data processing method, which is performed by the upper counting unit and the lower counting unit, comprises:

a first data processing on a first data signal, the first data processing comprising:

counting, by the upper counting unit, one of a plurality of clock signals output from the delay circuit with a first mode, the first mode being either one of a down-count mode and an up-count mode;

counting, by the lower counting unit, clock signals based on a predetermined number of the plurality of clock signals that is latched by the lower latching unit with the first mode, to output a first clock signal to the upper counting unit every time a counter value becomes a first predetermined value; and counting, by the upper counting unit, the first clock signal from the lower counting unit with the first mode;

a second data processing on a second data signal, the second data processing comprising:

counting, by the upper counting unit, one of the plurality of clock signals output from the delay circuit with a second mode, the second mode being the other one of the either one of the down-count mode and the up-count mode, while the value counted with the first mode is considered as a first initial value;

counting, by the lower counting unit, clock signals based on the predetermined number of the plurality of clock signals that is latched by the lower latching unit with the second mode, to output a second clock signal to the upper counting unit every time the counter value becomes a second predetermined value while the value counted with the first mode is considered as a second initial value; and counting, by the upper counting unit, the second clock signal from the lower counting unit with the second mode; and outputting the counter values counted by the upper counting unit and the lower counting unit with the second mode as difference data between the first data signal and the second data signal that are based on the output from the delay circuit according to the pixel signals.

4. The solid-state image pickup device according to claim 3, wherein the pixel signals include a reference level and a signal level, the first data signal is based on an output of the delay circuit according to either one of the reference level and the signal level, and the second data signal is based on an output of the delay circuit according to another one of the reference level and the signal level.

* * * * *